(12) United States Patent
Cao et al.

(10) Patent No.: US 9,105,796 B2
(45) Date of Patent: Aug. 11, 2015

(54) CZTS/SE PRECURSOR INKS AND METHODS FOR PREPARING CZTS/SE THIN FILMS AND CZTS/SE-BASED PHOTOVOLTAIC CELLS

(75) Inventors: Yanyan Cao, Wilmington, DE (US); Jonathan V Caspar, Wilmington, DE (US); Michael S Denny, Jr., Springfield, PA (US); Lynda Kaye Johnson, Wilmington, DE (US); Meijun Lu, Hockessin, DE (US); Daniela Rodica Radu, West Grove, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 548 days.

(21) Appl. No.: 13/470,430

(22) Filed: May 14, 2012

(65) Prior Publication Data
US 2013/0125988 A1 May 23, 2013

Related U.S. Application Data

(63) Continuation-in-part of application No. 13/505,841, filed as application No. PCT/US2010/035792 on May 21, 2010, now abandoned.

(60) Provisional application No. 61/264,362, filed on Nov. 25, 2009.

(51) Int. Cl.
*B82Y 30/00* (2011.01)
*B82Y 40/00* (2011.01)
(Continued)

(52) U.S. Cl.
CPC .............. *H01L 31/18* (2013.01); *B22F 1/0022* (2013.01); *C23C 18/1204* (2013.01); *C23C 18/127* (2013.01); *C23C 18/1225* (2013.01); *C23C 18/1275* (2013.01); *C23C 18/1279* (2013.01); *C23C 18/1283* (2013.01); *C23C 18/1295* (2013.01); *H01L 21/02554* (2013.01); *H01L 21/02568* (2013.01); *H01L 21/02628* (2013.01); *H01L 31/0322* (2013.01); *H01L 31/0326* (2013.01); *H01L 31/0368* (2013.01); *H01L 31/0384* (2013.01); *H01L 31/072* (2013.01); *Y02E 10/50* (2013.01)

(58) Field of Classification Search
USPC .................. 438/63, 84, 95; 252/501.1, 519.4, 252/519.5, 520.1; 257/E27.125, E31.008; 427/76; 423/511
See application file for complete search history.

(56) References Cited

U.S. PATENT DOCUMENTS 7,867,557 B2 * 1/2011 Pickett et al. ................. 427/214
2006/0062902 A1 3/2006 Sager et al.
(Continued)

FOREIGN PATENT DOCUMENTS

WO 2009076322 A2 6/2009
WO 2010138636 A2 12/2010
WO 2011051012 A1 5/2011

*Primary Examiner* — Victor A Mandala
*Assistant Examiner* — Regan J Rundio

(57) ABSTRACT

The present invention relates to coated binary and ternary chalcogenide nanoparticle compositions that can be used as copper zinc tin chalcogenide precursor inks. In addition, this invention relates to coated substrates comprising binary and ternary chalcogenide nanoparticle compositions and provides processes for manufacturing these coated substrates. This invention also relates to compositions of copper zinc tin chalcogenide thin films and photovoltaic cells comprising such films. In addition, this invention provides processes for manufacturing copper zinc tin chalcogenide thin films, as well as processes for manufacturing photovoltaic cells incorporating such films.

19 Claims, 7 Drawing Sheets

(51) Int. Cl.
| | |
|---|---|
| *H01L 31/0272* | (2006.01) |
| *H01L 21/20* | (2006.01) |
| *B05D 5/12* | (2006.01) |
| *C09D 11/52* | (2014.01) |
| *H01L 31/18* | (2006.01) |
| *H01L 31/032* | (2006.01) |
| *B22F 1/00* | (2006.01) |
| *H01L 21/02* | (2006.01) |
| *H01L 31/0368* | (2006.01) |
| *H01L 31/0384* | (2006.01) |
| *H01L 31/072* | (2012.01) |
| *C23C 18/12* | (2006.01) |

(56) References Cited

U.S. PATENT DOCUMENTS

| | | | |
|---|---|---|---|
| 2007/0163640 A1* | 7/2007 | Van Duren et al. | 136/262 |
| 2007/0167554 A1* | 7/2007 | Ryang | 524/492 |
| 2007/0249747 A1* | 10/2007 | Tsuji et al. | 522/3 |
| 2008/0110495 A1* | 5/2008 | Onodera et al. | 136/256 |
| 2009/0235987 A1* | 9/2009 | Akhtar et al. | 136/262 |
| 2012/0138866 A1* | 6/2012 | Agrawal et al. | 252/501.1 |

* cited by examiner

CZTS/SE PRECURSOR INKS AND METHODS FOR PREPARING CZTS/SE THIN FILMS AND CZTS/SE-BASED PHOTOVOLTAIC CELLS

This application claims priority under 35 U.S.C. §119(e) from U.S. Provisional Application No. 61/264,362 filed Nov. 25, 2009 and U.S. patent application Ser. No. 13/505,841 which are incorporated herein in their entirety as a part hereof.

FIELD OF THE INVENTION

The present invention relates to coated binary and ternary chalcogenide nanoparticle compositions that can be used as copper zinc tin chalcogenide precursor inks. In addition, this invention relates to coated substrates comprising binary and ternary chalcogenide nanoparticle compositions and provides processes for manufacturing these coated substrates. This invention also relates to compositions of copper zinc tin chalcogenide thin films and photovoltaic cells comprising such films. In addition, this invention provides processes for manufacturing copper zinc tin chalcogenide thin films, as well as processes for manufacturing photovoltaic cells incorporating such films.

BACKGROUND

Thin-film photovoltaic cells typically use semiconductors such as CdTe or copper indium gallium sulfide/selenide (CIGS) as an energy absorber material. Due to the limited availability of indium, alternatives to CIGS are sought. Kesterite ($Cu_2ZnSnS_4$ or "CZTS") possesses a band gap energy of about 1.5 eV and a large absorption coefficient (approx. $10^4$ $cm^{-1}$), making it a promising CIGS replacement. In addition, CZTS contains only non-toxic and abundant elements.

Current techniques to make CZTS thin films (e.g., thermal evaporation, sputtering, hybrid sputtering, pulsed laser deposition and electron beam evaporation) require complicated equipment and therefore tend to be expensive. Electrochemical deposition is an inexpensive process, but compositional non-uniformity and/or the presence of secondary phases prevents this method from generating high quality CZTS thin films. CZTS thin films can also be made by the spray pyrolysis of a solution containing metal salts, typically CuCl, $ZnCl_2$, $SnCl_4$, and thiourea as the sulfur source. This method tends to yield films of poor morphology, density and grain size. Photochemical deposition has also been shown to generate p-type CZTS thin films. However, the composition of the product is not well controlled, and it is difficult to avoid the formation of impurities such as hydroxides. Quaternary CZTS precursor powders can be prepared and deposited on a substrate by standard printing techniques. Subsequent annealing in a nitrogen and sulfur atmosphere leads to the formation of CZTS films. However, it is difficult to control the molar ratio of elements in the CZTS powder, which limits the ultimate performance of the CZTS thin film.

The formation of kesterite from uncoated binary and ternary sulfides has also been disclosed.

However, there still exists a need for a process that provides high quality CZTS thin films at a low cost.

DETAILED DESCRIPTION

Figure 1:
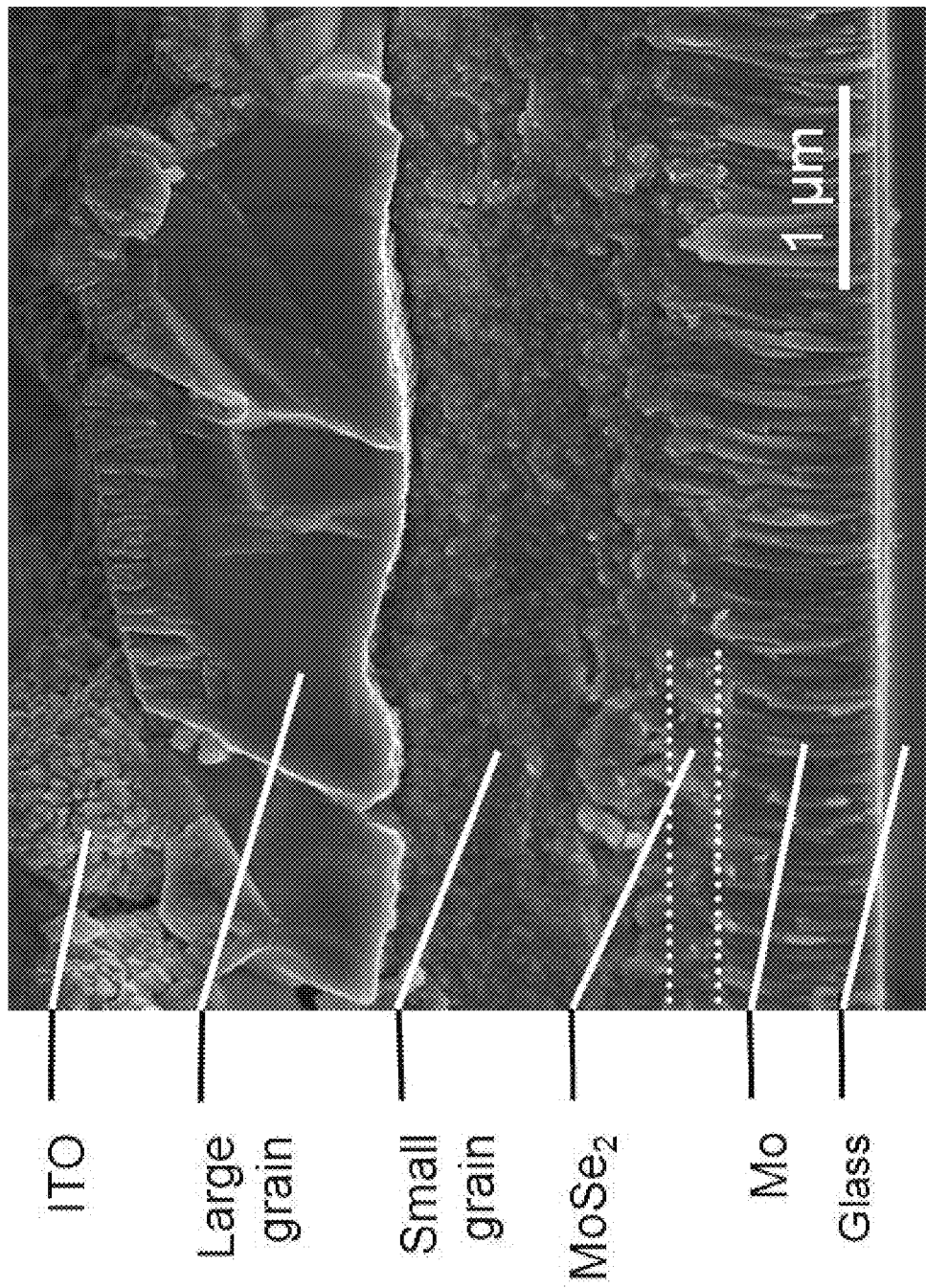
FIG. 1 shows a scanning electron microscopy (SEM) image of a fractured cross-section of the device described in Example 13.

One aspect of this invention provides nanoparticle compositions that can be used as copper zinc tin chalcogenide precursor inks. The nanoparticle compositions comprise mixtures of binary and/or ternary chalcogenides.

Another aspect of this invention provides coated substrates comprising a substrate and a coating comprising one or more layers comprising mixtures of binary and/or ternary chalcogenides.

Another aspect of this invention provides processes for manufacturing coated substrates comprising a substrate and a coating comprising one or more layers comprising mixtures of binary and/or ternary chalcogenides.

Another aspect of this invention provides processes for manufacturing copper zinc tin chalcogenide thin films using the copper zinc tin chalcogenide precursor inks. The copper zinc tin chalcogenide films can be used as absorbers in thin-film photovoltaic cells.

Another aspect of this invention provides processes for using CZTS, CZTSe or CZTS/Se precursor inks to make thin film photovoltaic cells.

Another aspect of this invention provides for CZTS/Se film compositions comprising adjacent first and second layers, wherein the first layer comprises CZTS/Se grains characterized by an average diameter of at least 0.3 microns; and the second layer comprises CZTS/Se and ZnS/Se nanoparticles embedded in a carbon matrix.

Another aspect of this invention provides for photovoltaic cells comprising CZTS/Se film compositions comprising adjacent first and second layers wherein the first layer comprises CZTS/Se grains characterized by an average diameter of at least 0.3 microns; and the second layer comprises CZTS/Se and ZnS/Se nanoparticles embedded in a carbon matrix.

Herein, the terms "solar cell" and "photovoltaic cell" are synonymous unless specifically defined otherwise. These terms refer to devices that use semiconductors to convert visible and near-visible light energy into usable electrical energy.

Herein, grain size refers to the diameter of a grain of granular material, wherein the diameter is defined as the longest distance between two points on the surface of the grain. Crystallite size is the size of a single crystal inside the grain. A single grain can be composed of several crystals. Methods for determining grain size are known in the art.

Herein, the term adjacent layers refers to two layers of a coating or film that border each other on one side of each layer, i.e., one layer lies on top of the other layer. As used herein, the term "chalcogen" refers to Group 16 elements, and the terms "metal chalcogenides" or "chalcogenides" refer to materials that comprise metals and Group 16 elements. Suitable Group 16 elements include sulfur, selenium, and tellurium. Herein, the term "binary-metal chalcogenide" refers to a chalcogenide composition comprising one metal. The term "ternary-metal chalcogenide" refers to a chalcogenide composition comprising two metals. The term "quaternary-metal chalcogenide" refers to a chalcogenide composition comprising three metals. The term "multinary-metal chalcogenide" refers to a chalcogenide composition comprising two or more metals, and encompasses ternary and quaternary metal chalcogenide compositions.

Herein, the terms "copper tin sulfide" and "CTS" refer to $Cu_2SnS_3$. "Copper tin selenide" and "CTSei" refer to $Cu_2SnSe_3$. "Copper tin sulfide/selenide," "CTS/Se," and "CTS-Se" encompass all possible combinations of $Cu_2Sn(S, Se)_3$, including $Cu_2SnS_3$, $Cu_2SnSe_3$, and $Cu_2SnS_xSe_{3-x}$, where $0 \leq v \leq 3$. The terms "copper tin sulfide," "copper tin selenide," "copper tin sulfide/selenide," "CTS," "CTSe," "CTS/Se" and "CTS-Se" further encompass fractional stoichiometries, e.g., $Cu_{1.80}Sn_{1.05}S_3$. That is, the stoichiometry of the elements can vary from a strictly 2:1:3 molar ratio. Similarly, the terms "$Cu_2S/Se$," "CuS/Se," "$Cu_4Sn(S/Se)_4$," "$Sn(S/Se)_2$," "SnS/Se," and "ZnS/Se" encompass fractional stoichiometries and all possible combinations of $Cu_2(S_y, Se_{1-y})$, $Cu(S_y Se_{1-y})$, $Cu_4Sn(S_y Se_{1-y})_4$, $Sn(S_y Se_{1-y})_2$, $Sn(S_y Se_{1-y})$, and $Zn(S_y Se_{1-y})$ from $0 \leq y \leq 1$.

Herein, the term "CZTS" refers to $Cu_2ZnSnS_4$, "CZTSe" refers to $Cu_2ZnSnSe_4$, and "CZTS/Se" encompasses all possible combinations of $Cu_2ZnSn(S,Se)_4$, including $Cu_2ZnSnS_4$, $Cu_2ZnSnSe_4$, and $Cu_2ZnSnS_xSe_{4-x}$, where $0 \leq x \leq 4$. The terms "CZTS," "CZTSe," and "CZTS/Se" further encompass copper zinc tin sulfide/selenide semiconductors with fractional stoichiometries, e.g., $Cu_{1.94}Zn_{0.63}Sn_{1.3}S_4$. That is, the stoichiometry of the elements can vary from strictly 2:1:1:4. Materials designated as CZTS/Se can also contain small amounts of other elements such as sodium. In addition, the Cu, Zn and Sn in CZTS/Se can be partially substituted by other metals. That is, Cu can be partially replaced by Ag and/or Au; Zn by Mn, Fe, Co, Ni, Cd and/or Hg; and Sn by C, Si, Ge and/or Pb.

The ratio of Cu:Zn:Sn in a CZTS/Se precursor ink can differ from the ratio of Cu:Zn:Sn in an annealed film of CZTS/Se derived from a coating of that ink. For example, volatilization of metals or metal chalcogenides can occur during the annealing process.

To date, the highest efficiencies have been measured for copper-poor CZTS/Se solar cells, where by "copper-poor" it is understood that the ratio Cu/(Zn+Sn) is less than 1.0. For high efficiency devices, a molar ratio of zinc to tin greater than one is also desirable.

The term "kesterite" is commonly used to refer to materials belonging to the kesterite family of minerals and is also the common name of the mineral CZTS. As used herein, the term "kesterite" refers to crystalline compounds in either the I4- or I4-2m space groups having the nominal formula $Cu_2ZnSn(S, Se)_4$. It also refers to "atypical kesterites," wherein zinc has replaced a fraction of the copper, or copper has replaced a fraction of the zinc, to give $Cu_cZn_zSn(S,Se)_4$, wherein c is greater than two and z is less than one, or c is less than two and z is greater than one. The term "kesterite structure" refers to the structure of these compounds.

As used herein, "coherent domain size" refers to the size of crystalline domains over which a defect-free, coherent structure exists. When the coherent grain size is less than about 100 nm in size, appreciable broadening of the x-ray diffraction lines occurs. The domain size can be estimated by measuring the full width at half maximum intensity of the diffraction peak.

X-ray absorption near-edge spectroscopy (XANES) can be used to identify chemical phases. Small coherent domain size phases, which may diffract too broadly for reliable detection by x-ray diffraction, can be identified and quantified with XANES.

The term "nanoparticle" is meant to include chalcogenide-containing particles characterized by a longest dimension of about 1 nm to about 1000 nm, or about 5 nm to about 500 nm, or about 10 nm to about 100 nm. Nanoparticles can be in the shape of spheres, rods, wires, tubes, flakes, whiskers, rings, disks, or prisms. Herein, by nanoparticle "size" or "size range" or "size distribution," we mean that the average longest dimension of a plurality of nanoparticles falls within the specified range. "Longest dimension" is defined herein as the measurement of a nanoparticle from end to end along the major axis of the projection. The "longest dimension" of a particle will depend on the shape of the particle. For example, for particles that are roughly or substantially spherical, the longest dimension will be a diameter of the particle.

As defined herein, "coated particles" refers to particles that have a surface coating of organic or inorganic material. Methods for surface-coating inorganic particles are well-known in the art. As defined herein, the terms "surface coating," "stabilizing agent," and "capping agent" are used synonymously and refer to a strongly absorbed or chemically bonded monolayer of organic or inorganic molecules on the surface of the particle(s). In addition to carbon and hydrogen, the organic capping agents comprise donor atoms selected from the group consisting of nitrogen, oxygen, sulfur, selenium, and phosphorus donor atoms. Herein, the donor atom of a capping agent refers to the atom within a capping agent that absorbs or chemically bonds to the surface of the particle(s). Suitable inorganic capping agents can comprise chalcogenides, including metal chalcogenides, and zintl ions, wherein zintl ions refers to homopolyatomic anions and heteropolyatomic anions that have intermetallic bonds between the same or different metals of the main group, transition metals, lanthanides, and/or actinides. Herein, all reference to wt % of particles is meant to include any surface coating that may be present.

Elemental and metal chalcogenide particles can be composed only of the specified elements or can be doped with small amounts of other elements. As used herein, the term "alloy" refers to a substance that is a mixture, as by fusion, of two or more metals.

Herein, by "O-, N-, S-, or Se-based functional groups" is meant univalent groups other than hydrocarbyl and substituted hydrocarbyl that comprise O-, N-, S-, or Se-heteroatoms, wherein the free valence is located on this heteroatom. Examples of O-, N-, S-, and Se-based functional groups include alkoxides, amidos, thiolates, and selenolates.

Herein, the term "metal salts" refers to compositions wherein metal cations and inorganic anions are joined by ionic bonding. Relevant classes of inorganic anions comprise oxides, carbonates, sulfates and halides.

Herein, the term "metal complexes" refers to compositions wherein a metal is bonded to a surrounding array of molecules or anions, typically called "ligands" or "complexing agents." The atom within a ligand that is directly bonded to the metal atom or ion is called the "donor atom" and, herein, often comprises nitrogen, oxygen, selenium, or sulfur.

Herein, ligands are classified according to M. L. H. Green's "Covalent Bond Classification (CBC) Method." An "X-function ligand" is one which interacts with a metal center via a normal 2-electron covalent bond, composed of 1 electron from the metal and 1 electron from the X ligand. Simple examples of X-type ligands include alkyls and thiolates.

Herein, the term "nitrogen-, oxygen-, carbon-, sulfur-, and selenium-based organic ligands" refers specifically to carbon-containing X-function ligands, wherein the donor atom comprises nitrogen, oxygen, carbon, sulfur, or selenium. Herein, the term "complexes of nitrogen-, oxygen-, carbon-, sulfur-, and selenium-based organic ligands" refers to the metal complexes comprising these ligands. Examples include metal complexes of amidos, alkoxides, acetylacetonates, acetates, carboxylates, hydrocarbyls, O-, N-, S-, Se-, and halogen-substituted hydrocarbyls, thiolates, selenolates, thiocarboxylates, selenocarboxylates, dithiocarbamates, and diselenocarbamates.

As defined herein, a "hydrocarbyl group" is a univalent group containing only carbon and hydrogen. Examples of hydrocarbyl groups include unsubstituted alkyls, cycloalkyls, and aryl groups, including alkyl-substituted aryl groups. Suitable hydrocarbyl groups and alkyl groups contain 1 to about 30 carbons, or 1 to 25, 1 to 20, 1 to 15, 1 to 10, 1 to 5, 1 to 4, or 1 to 2 carbons. By "heteroatom-substituted hydrocarbyl" is meant a hydrocarbyl group that contains one or more heteroatoms wherein the free valence is located on carbon. Suitable heteroatom substituents include O-, N-, S-, Se-, halogen-, and tri(hydrocarbyl)silyl. Examples of heteroatom-substituted hydrocarbyls include hydroxyethyl, carbomethoxyethyl and trifluoromethyl. Herein, the term "tri(hydrocarbyl)silyl" encompasses silyl substituents, wherein the substituents on silicon are hydrocarbyls.

Herein, grain size refers to the diameter of a grain of granular material, wherein the diameter is defined as the longest distance between two points on its surface. In contrast, crystallite size is the size of a single crystal inside the grain. A single grain can be composed of several crystals. A useful method for obtaining grain size is electron microscopy. ASTM test methods (ASTM E 112, E1182 and E1382) are available for determining planar grain size.

One aspect of this invention is a CZTS/Se precursor ink comprising:
a) a fluid medium;
b) coated binary or ternary copper-containing chalcogenide nanoparticles;
c) coated binary or ternary tin-containing chalcogenide nanoparticles; and
d) coated binary zinc-containing chalcogenide nanoparticles, wherein the molar ratio of Cu:Zn:Sn is about 2:1:1 and the ratio of total chalcogen to (Cu+Zn+Sn) of the CZTS/Se precursor ink is at least about 1.

This ink is referred to as a CZTS/Se precursor ink, as it contains the precursors for forming a CZTS/Se thin film. In some embodiments, the ink consists essentially of components (a)-(d). In some embodiments, the ink further comprises an elemental chalcogen selected from the group consisting of sulfur, selenium, and mixtures thereof. In some embodiments, the copper-containing chalcogenide is selected from the group consisting of $Cu_2S$, $CuS$, $Cu_2Se$, $CuSe$, $Cu_2(S,Se)$, $Cu(S,Se)$, $Cu_2SnS_3$, $Cu_4SnS_4$, $Cu_2SnSe_3$, $Cu_2Sn(S,Se)_3$, and mixtures thereof. In some embodiments, the tin-containing chalcogenide is selected from the group consisting of $SnS_2$, $SnS$, $SnSe_2$, $SnSe$, $Sn(S,Se)_2$, $Sn(S,Se)$, $Cu_2SnS_3$, $Cu_4SnS_4$, $Cu_2SnSe_3$, $Cu_2Sn(S,Se)_3$, and mixtures thereof. In some embodiments, the zinc-containing chalcogenide is selected from the group consisting of $ZnS$, $ZnSe$, $Zn(S,Se)$, and mixtures thereof. In some embodiments, the copper-, tin-, and zinc-containing chalcogenides comprise: (a) $CuS$, $SnS$, and $ZnS$; (b) $Cu_2SnS_3$ and $ZnS$; (c) $Cu_2SnS_3$, $ZnS$, and $SnS$; or (d) $Cu_2SnS_3$, $CuS$, $ZnS$, and $SnS$. In some embodiments, the copper-, tin-, and zinc-containing chalcogenides consist essentially of: (a) $CuS$, $SnS$, and $ZnS$; (b) $Cu_2SnS_3$ and $ZnS$; (c) $Cu_2SnS_3$, $ZnS$, and $SnS$; or (d) $Cu_2SnS_3$, $CuS$, $ZnS$, and $SnS$.

In some embodiments, the amount of Cu, Zn, and Sn can deviate from a 2:1:1 molar ratio by +/−40 mole %, +/−30 mole %, +/−20 mole %, +/−10 mole %, or +/−5 mole %. Hence, the molar ratio of Cu:Zn:Sn of the CZTS/Se precursor ink can be, for example, 1.75:1:1.35 or 1.78:1:1.26 or other non-integer ratios. In some embodiments, the molar ratio of Cu to (Zn+Sn) is less than one. In some embodiments, the molar ratio of Zn to Sn is greater than one.

As defined herein, sources for the total chalcogen include the metal chalcogenides (e.g., the coated Cu-, Zn- or Sn-containing chalcogenide nanoparticles) and the optional elemental chalcogen compound. As defined herein, the moles of total chalcogen are determined by multiplying the moles of each metal chalcogenide by the number of equivalents of chalcogen that it contains and then summing these quantities together with the number of moles of any optional elemental chalcogen compound present in the ink. Although moles of sulfur- and selenium-based capping agents and fluid media present can contribute to the amount of total chalcogenide, they are not included in this calculation. The moles of (Cu+Zn+Sn) are determined by multiplying the moles of each Cu- or Zn- or Sn-containing species by the number of equivalents of Cu or Zn or Sn that it contains and then summing these quantities. As an example, the molar ratio of total chalcogen to (Cu+Zn+Sn) for an ink comprising sulfur, $Cu_2S$ particles, ZnS particles, and $SnS_2$ particles=[(moles of S)+(moles of $Cu_2S$)+(moles of ZnS)+2(moles of $SnS_2$)]/[2(moles of $Cu_2S$)+(moles of ZnS)+(moles of $SnS_2$)].

Suitable Cu-containing binary or ternary chalcogenide nanoparticles include: $Cu_2S/Se$ particles, $CuS/Se$ particles, $Cu_2Sn(S/Se)_3$ particles, $Cu_4Sn(S/Se)_4$ particles, and mixtures thereof. Suitable Zn-containing binary chalcogenide nanoparticles include $ZnS/Se$ particles. Suitable Sn-containing binary or ternary chalcogenide nanoparticles include: $Sn(S/Se)_2$ particles, $SnS/Se$ particles, $Cu_2Sn(S/Se)_3$ particles, $Cu_4Sn(S/Se)_4$ particles, and mixtures thereof. In some embodiments, the binary or ternary Cu-, Zn- or Sn-containing chalcogenide nanoparticles can be purchased from Reade Advanced Materials (Providence, R.I.) or synthesized according to known techniques, such as: decomposition and reduction of metal salts and complexes; chemical vapor deposition; electrochemical deposition; use of gamma-, x-ray, laser or UV-irradiation; ultrasonic or microwave treatment; electron- or ion-beams; arc discharge; electric explosion of wires; or biosynthesis.

The term "coated nanoparticles" used herein refers to binary and ternary chalcogenide nanoparticles that are coated with one or more stabilizing agents. The stabilizing agent can aid in the dispersion of particles and can also inhibit their interaction and agglomeration in the ink. Suitable stabilizing agents include:

(a) Organic molecules comprising N-, O-, S-, Se- or P-based donor atoms;
(b) Lewis bases;
(c) Amines, thiols, selenols, phosphine oxides, phosphines, phosphinic acids, pyrrolidones, pyridines, carboxylates, phosphates, heteroaromatics, peptides, and alcohols;
(d) Alkyl amines, alkyl thiols, alkyl selenols, trialkylphosphine oxide, trialkylphosphines, alkylphosphonic acids, polyvinylpyrrolidone, polycarboxylates, polyphosphates, polyamines, pyridine, alkylpyridines, aminopyridines, peptides comprising cysteine and/or histidine residues, ethanolamines, citrates, thioglycolic acid, oleic acid, and polyethylene glycol;

(e) Inorganic chalcogenides, including metal chalcogenides, and zintl ions;

(f) $S^{2-}$, $Se^{2-}$, $Se_2^{2-}$, $Se_3^{2-}$, $Se_4^{2-}$, $Se_6^{2-}$, $Te_2^{2-}$, $Te_3^{2-}$, $Te_4^{2-}$, $Sn_4^{2-}$, $Sn_5^{2-}$, $Sn_9^{3-}$, $Sn_9^{4-}$, $SnS_4^{-4}$, $SnSe_4^{-4}$, $SnTe_4^{4-}$, $Sn_2S_6^{4-}$, $Sn_2Se_6^{4-}$, $Sn_2Te_6^{4-}$, wherein the positively charged counterions can be alkali metal ions, ammonium, hydrazinium, or tetraalkylammonium;

(g) Degradable capping agents, including dichalcogenocarbamates, monochalcogenocarbamates, xanthates, trithiocarbonates, dichalcogenoimidodiphosphates, thiobiurets, dithiobiurets, chalcogenosemicarbazides, and tetrazoles. These capping agents can be degraded by thermal and/or chemical processes, such as acid- and base-catalyzed processes. Degradable capping agents include: dialkyl dithiocarbamates, dialkyl monothiocarbamates, dialkyl diselenocarbamates, dialkyl monoselenocarbamates, alkyl xanthates, alkyl trithiocarbonates, disulfidoimidodiphosphates, diselenoimidodiphosphates, tetraalkyl thiobiurets, tetraalkyl dithiobiurets, thiosemicarbazides, selenosemicarbazides, tetrazole, alkyl tetrazoles, amino-tetrazoles, thio-tetrazoles, and carboxylated tetrazoles. In some embodiments, Lewis bases (e.g., amines) can be added to nanoparticles stabilized by carbamate, xanthate, and trithiocarbonate capping agents to catalyze their removal from the nanoparticle;

(h) Molecular precursor complexes to copper chalcogenides, zinc chalcogenides, and tin chalcogenides, including CuS/Se, $Cu_2S/Se$, ZnS/Se, SnS/Se, $Sn(S/Se)_2$, $Cu_2Sn(S/Se)_3$, and $Cu_2ZnSn(S/Se)_4$. Ligands for these molecular precursor complexes include: thio groups, seleno groups, thiolates, selenolates, and thermally degradable ligands, as described above. Thiolates and selenolates include: alkyl thiolates, alkyl selenolates, aryl thiolates, and aryl selenolates;

(i) The solvent in which the particle is formed, such as oleylamine;

(j) Short-chain carboxylic acids, such as formic, acetic, or oxalic acids; and (k) Thiols.

The Lewis base can be chosen such that it has a boiling temperature at ambient pressure that is greater than or equal to about 200° C., 150° C., 120° C., or 100° C., and/or can be selected from the group consisting of organic amines, phosphine oxides, phosphines, thiols, and mixtures thereof. Suitable amines include dodecylamine, tetradecyl amine, hexadecyl amine, octadecyl amine, oleylamine, and trioctyl amine. In some embodiments, the stabilizing agent comprises a surfactant or a dispersant.

In some embodiments, suitable thiol-based stabilizing agents include: (a) alkyl thiols; (b) $C_1$-$C_8$ alkyl thiols; (c) $C_1$-$C_6$ alkyl thiols; (d) $C_1$-$C_4$ alkyl thiols; (e) $C_1$-$C_3$ alkyl thiols; or (f) 1-propanethiol, 1-butanethiol, 2-butanethiol, 2-methyl-1-propanethiol, t-butyl thiol, 1-pentanethiol, 3-methyl-1-butanethiol, cyclopentanethiol, 1-hexanethiol, cyclohexanethiol, 1-heptanethiol, 1-octanethiol, 2-ethylhexanethiol, 1-nonanethiol, tert-nonyl mercaptan, 1-decanethiol, 2-mercaptoethanol, 4-cyano-1-butanethiol, butyl 3-mercaptoprorionate, methyl 3-mercaptoproprionate, 1-mercapto-2-propanol, 3-mercapto-1-propanol, 4-mercapto-1-butanol, 6-mercapto-1-hexanol, 2-phenylethanethiol, thiophenol, and mixtures thereof.

In some embodiments, the particles comprise a volatile stabilizing agent. A stabilizing agent is considered volatile if, instead of decomposing and potentially introducing impurities when a composition or ink of nanoparticles is formed into a film, it evaporates during film deposition, drying or annealing. Volatile stabilizing agents include those having a boiling point less than about 200° C., 150° C., 120° C., or 100° C. at ambient pressure. Volatile stabilizing agents can be adsorbed or bonded onto particles during synthesis or during an exchange reaction. Thus, in one embodiment, particles, or an ink or reaction mixture of particles stabilized by a first stabilizing agent, as incorporated during synthesis, are mixed with a second stabilizing agent that has greater volatility, to exchange in the particles the second stabilizing agent for the first stabilizing agent. Suitable volatile stabilizing agents include: ammonia, methyl amine, ethyl amine, butylamine, tetramethylethylene diamine, acetonitrile, ethyl acetate, butanol, pyridine, methane, ethanethiol, 1-propanethiol, 1-butanethiol, 2-butanethiol, 2-methyl-1-propanethiol, t-butyl thiol, 1-pentanethiol, 3-methyl-1-butanethiol, cyclopentanethiol, 1-hexanethiol, cyclohexanethiol, tetrahydrofuran, and diethyl ether. Suitable volatile capping agents can also include: amines, amidos, amides, nitriles, isonitriles, cyanates, isocyanates, thiocyanates, isothiocyanates, azides, thiocarbonyls, thiols, thiolates, sulfides, sulfinates, sulfonates, phosphates, phosphines, phosphites, hydroxyls, hydroxides, alcohols, alcoholates, phenols, phenolates, ethers, carbonyls, carboxylates, carboxylic acids, carboxylic acid anhydrides, glycidyls, and mixtures thereof.

The ink comprises a fluid medium to carry the particles. The fluid medium typically comprises 30-99 wt %, 50-95 wt %, 60-90 wt %, 50-98 wt %, 60-98 wt %, 70-98 wt %, 75-98 wt %, 80-98 wt %, 85-98 wt %, 75-95 wt %, 80-95 wt %, or 85-95 wt % of the total weight of the CZTS/Se precursor ink. The fluid medium is either a fluid at room temperature or a low-melting solid with a melting point of less than about 100° C., 90° C., 80° C., 70° C., 60° C., 50° C., 40° C., or 30° C. In some embodiments, the fluid medium comprises solvents. Suitable solvents include: aromatics; heteroaromatics; alkanes; organic halides; ketones; esters; nitriles; amides; amines; thiols, thioethers, and other organic sulfur compounds; pyrrolidinones; ethers; alcohols; carbonates; water; and mixtures thereof.

Suitable aromatic solvents include: benzene, toluene, ethylbenzene, chlorobenzene, o-xylene, m-xylene, p-xylene, mesitylene, n-propylbenzene, i-propylbenzene, cumene, 1,2,4-trimethylbenzene, 1,3,5-trimethylbenzene, 1,2,3-trimethylbenzene, pseudocumene, 1-phenyl-but-2-ene, t-butylbenzene, n-butylbenzene, i-butylbenzene, sec-butylbenzene, sec-amylbenzene, 1,3-diisopropylbenzene, 1,4-diisopropylbenzene, 1,2-difluorobenzene, 3-phenoxytoluene, diphenylether, 3-methylanisole, phenol, 1-chlorobenzene, 2-chlorotoluene, 3-chlorotoluene, 4-chlorotoluene, 1,2-dichlorobenzene, 1,3-dichlorobenzene, 1,4-dichlorobenzene, 1,2,3-trichlorobenzene, 1,2,4-trichlorobenzene, 1,3,5-trichlorobenzene, 3-chloroanisole, and mixtures thereof.

Suitable heteroaromatic solvents include: pyridine, 2-methylpyridine, 3-methylpyridine, 4-methylpyridine, 3,5-lutidine, 2,6-lutidine, 4-t-butylpyridine, 2-aminopyridine, 3-aminopyridine, diethylnicotinamide, 3-cyanopyridine, 3-fluoropyridine, 3-chloropyridine, 2,3-dichloropyridine, 2,5-dichloropyridine, 5,6,7,8-tetrahydroisoquinoline, 6-chloro-2-picoline, 2-methoxypyridine, 3-(aminomethyl) pyridine, 2-amino-3-picoline, 2-amino-6-picoline, 2-amino-2-chloropyridine, 2,3-diaminopyridine, 3,4-diaminopyridine, 2-methylamino)pyridine, 2-dimethylaminopyridine, 2-(aminomethyl)pyridine, 2-(2-aminoethyl)pyridine, 2-methoxypyridine, 2-butoxypyridine, pyrrole, quinoline, and mixtures thereof.

Suitable alkanes include n-pentane, cyclopentane, isopentane, n-hexane, cyclohexane, methylcyclopentane, 2,2-dimethylbutane, 2,3-dimethylbutane, 2-methylpentane, 3-methylpentane, n-heptane, cycloheptane, 1,1-dimethylcyclopentane, 1,2-dimethylcyclopentane, 1,3- dimethylcyclopentane, methylcyclohexane, 2,4-dimethylpentane, 2,3-dimethylpentane, 3-hexane, n-octane, cyclooctane, 1,2-dimethylcyclohexane, 1,4-dimethylcyclohexane, ethylcyclohexane, 2,2,4-trimethylpentane, 2,3,4-trimethylpentane, 2,2-dimethylhexane, 2,4-dimethylhexane, 2,5-dimethylhexane, n-nonane, isopropylcyclohexane, 2,2,4-trimethylhexane, 2,2,5-trimethylhexane, n-decane, n-undecane, n-dodecane, and mixtures thereof.

Suitable organic halides include chloroform, dichloromethane, 1,1,1-trichloroethane, 1,1,2-trichloroethane, 1,1,2,2-tetrachloroethane, and mixtures thereof.

Suitable ketones include acetone, 2-butanone, 2-pentanone, 2-hexanone, 4-methyl-2-pentanone, 2-heptanone, 3-heptanone, 5-methyl-3-heptanone, 4-heptanone, methyl isoamyl ketone, 2-octanone, 5-methyl-2-octanone, diisobutyl ketone, cyclopentanone, cyclohexanone, methylcyclohexanone, 2,5-hexanedione, fenchone, acetophenone, and mixtures thereof.

Suitable esters include ethyl formate, propyl formate, butyl formate, amyl formate, hexyl formate, methyl acetate, ethyl acetate, n-propyl acetate, isopropyl acetate, n-butylacetate, sec-butylacetate, isobutylacetate, amyl acetate, sec-amyl acetate, pentacetate, methyl amyl acetate, 2-ethyl butyl acetate, 2-ethylhexylacetate, cyclohexylacetate, methylcyclohexanyl acetate, ethylene glycol monoacetate, ethylene glycol diacetate, ethylene glycol monomethyl ether acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, dipropylene glycol monomethyl ether acetate, methyl propionate, ethyl propionate, n-butyl propionate, amyl propionate, ethyl 3-ethoxypropionate, methyl butyrate, ethyl butyrate, n-butyl butyrate, ethyl oxybutyrate, isobutyl isobutyrate, 2,2,4-trimethylpentanediol-1,3-monoisobutyrate, 1-methoxy-2-propanol acetate, ethoxy propanol acetate, dimethyl succinate, dimethyl adipate, dimethyl glutarate, gamma-butyrolactone, diethyl oxalate, dibutyl oxalate, methyl lactate, ethyl lactate, propyl lactate, butyl lactate, amyl lactate, and mixtures thereof.

Suitable nitrile solvents include: acetonitrile, 3-ethoxypropionitrile, 2,2-diethoxypropionitrile, 3,3-diethoxypropionitrile, diethoxyacetonitrile, 3,3-dimethoxypropionitrile, 3-cyanopropionaldehyde dimethylacetal, dimethylcyanamide, diethylcyanamide, diisopropylcyanamide, 1-pyrrolidinecarbonitrile, 1-piperidinecarbonitrile, 4-morpholinecarbonitrile, methylaminoacetonitrile, butylaminoacetonitrile, dimethylaminoacetonitrile, diethylaminoacetonitrile, N-methyl-beta-alaninenitrile, 3,3'-iminopropionitrile, 3-(dimethylamino)propionitrile, 1-piperidinepropionitrile, 1-pyrrolidinebutyronitrile, propionitrile, butyronitrile, valeronitrile, isovaleronitrile, 3-methoxypropionitrile, 3-cyanopyridine, 4-amino-2-chlorobenzonitrile, 4-acetylbenzonitrile, and mixtures thereof.

Suitable amide solvents include: N,N-diethylnicotinamide, N-methylnicotinamide, formamide, N,N-dimethylformamide, N,N-diethylformamide, N,N-diisopropylformamide, N,N-dibutylformamide, N,N-dimethylacetamide, N,N-diethylacetamide, N,N-diisopropylacetamide, N,N-dimethylpropionamide, N,N-diethylpropionamide, N,N,2-trimethylpropionamide, acetamide, propionamide, isobutyramide, trimethylacetamide, nipecotamide, N,N-diethylnipecotamide, 1-formylpiperidine, and mixtures thereof.

Suitable amine solvents include: diethylamine, triethylamine, n-propylamine, isopropylamine, di-n-propylamine, diisopropylamine, n-butylamine, di-n-butylamine, tri-n-butylamine, isobutylamine, diisobutylamine, sec-butylamine, n-amylamine, sec-amylamine, diamylamine, triamylamine, n-hexylamine, sec-hexylamine, 2-ethylbutylamine, n-heptylamine, n-octylamine, 2-ethylhexylamine, di-2-ethylhexylamine, 3-methoxypropylamine, 2-methylbutylamine, isoamylamine, 1,2-dimethylpropylamine, hydrazine, ethylenediamine, 1,3-diaminopropane, 1,2-diaminopropane, 1,2-diamino-2-methylpropane, 1,3-diaminopentane, 1,1-dimethylhydrazine, N-ethylmethylamine, N-methylpropylamine, mono-n-butyl-diamylamine, N-methylethylenediamine, N-ethylethylenediamine, N-propylethylenediamine, N-isopropylethylenediamine, N,N'-dimethylethylenediamine, N,N-dimethylethylenediamine, N,N'-diethylethylenediamine, N,N-diethylethylenediamine, N,N-diisopropylethylenediamine, N,N-dibutylethylenediamine, N,N,N'-trimethylethylenediamine, 3-dimethylaminopropylamine, 3-diethylaminopropylamine, diethylenetriamine, tetraethylenepentamine, cyclohexylamine, dicyclohexylamine, 2-methoxyethylamine, bis(2-methoxyethyl)amine, 2-ethoxyethylamine, bis(2-ethoxyethyl)amine, 1-methoxyisopropylamine, aminoacetaldehyde diethyl acetal, methylaminoacetaldehyde dimethyl acetal, N,N-dimethylacetamide dimethyl acetal, dimethylaminoacetaldehyde diethyl acetal, diethylaminoacetaldehyde diethyl acetal, 4-aminobutyraldehyde diethyl acetal, 2-methylaminomethyl-1,3-dioxolane, ethanolamine, 3-amino-1-propanol, 2-hydroxyethylhydrazine, N,N-diethylhydroxylamine, 4-amino-1-butanol, 2-amino-1-butanol, 2-amino-2-methyl-1-propanol, 2-amino-2-methyl-1,3-propanediol, 2-amino-2-ethyl-1,3-propanediol, tris(hydroxymethyl)aminomethane, 2-(2-aminoethoxy)ethanol, 2-(methylamino)ethanol, 2-(ethylamino)ethanol, 2-(propylamino)ethanol, diethanolamine, triethanolamine, diisopropanolamine, triisopropanolamine, N,N-dimethylethanolamine, N,N-diethylethanolamine, 2-(dibutylamino)ethanol, 3-dimethylamino-1-propanol, 3-diethylamino-1-propanol, 1-dimethylamino-2-propanol, 1-diethylamino-2-propanol, N-methyldiethanolamine, N-ethyldiethanolamine, 3-amino-1,2-propanediol, piperazine, aminoethylpiperazine, 2-aminoethylethanolamine, 1-diethylamino-2,3-propanediol, 2-diethylamino-2-methyl-1-propanol, N-ethyl ethanolamine, N-butyl ethanolamine, N-ethyl diethanolamine, N-butyl diethanolamine, triethanolammonium hydroxide, aniline, dimethylaniline, diethylaniline, diethylbenzylamine, ethylene imine, propylene imine, piperazine, 1,2,4-trimethylpiperazine, morpholine, N-ethylmorpholine, N-phenylmorpholine, and mixtures thereof.

Suitable thiol, thioethers, and other organic sulfur-based solvents include 1-propanethiol, 1-butanethiol, 2-butanethiol, 2-methyl-1-propanethiol, t-butyl thiol, 1-pentanethiol, 3-methyl-1-butanethiol, cyclopentanethiol, 1-hexanethiol, cyclohexanethiol, 1-heptanethiol, 1-octanethiol, 2-ethyhexanethiol, 1-nonanethiol, tert-nonyl mercaptan, 1-decanethiol, 2-mercaptoethanol, 4-cyano-1-butanethiol, butyl 3-mercaptoprionate, methyl 3-mercaptoproprionate, 1-mercapto-2-propanol, 3-mercapto-1-propanol, 4-mercapto-1-butanol, 6-mercapto-1-hexanol, 2-phenylethanethiol, thiophenol, diethylsulfide, carbon disulfide, dimethylsulfoxide, sulfolane, 2-(ethylsulfonyl)ethanol, thiodiethyleneglycol, and mixtures thereof.

Suitable pyrrolidinone solvents include: 2-pyrrolidinone, N-methyl-2-pyrrolidinone, N-ethyl-2-pyrrolidinone, N-cyclohexyl-2-pyrrolidinone, N-(2-hydroxyethyl)pyrrolidinone, 5-methyl-2-pyrrolidinone, 3-methyl-2-pyrrolidinone, 2-pyrrolidinone, 1,5-dimethyl-2-pyrrolidinone, 1-ethyl-2-pyrrolidinone, 1-(2-hydroxyethyl)-2-pyrrolidinone, 5-methoxy-2-pyrrolidinone, 1-(3-aminopropyl)-2-pyrrolidinone, and mixtures thereof.

Suitable ether solvents include diethyl ether, diisopropyl ether, dibutyl ether, diamyl ether, dihexyl ether, tetrahydrofuran, dimethoxymethane, dioxane, trioxane, vinyl isopropyl ether, vinyl isobutyl ether, vinyl butyl ether, vinyl 2-ethylhexyl ether, methyl phenyl ether, n-butyl phenyl ether, amyl phenyl ether, amyl tolyl ether, amyl xylyl ether, diphenyl ether, furan, 2-methylfuran, 2,3-dihydropyran, tetrahydropyran, terpinyl methyl ether, 1,3-dioxolane, ethylene glycol dimethyl ether, ethylene glycol diethyl ether, diethylene glycol dimethyl ether, dipropylene glycol dimethyl ether, diethylene glycol diethyl ether, triethylene glycol dimethyl ether, diethylene glycol dibutyl ether, tetraethylene glycol dimethyl ether, poly(ethylene glycol) dimethyl ether, highlyme (methyl ether of >C9 alcohol ethoxylated with >five moles of ethylene oxide, CAS #366009-01-0), and mixtures thereof.

Suitable alcohol solvents include: methoxyethoxyethanol, methanol, ethanol, isopropanol, 1-propanol, 1-butanol, isobutanol, sec-butanol, t-butanol, 2-pentanol, 2-methyl-1-butanol, 3-methyl-1-butanol, 2-hexanol, 4-methyl-2-pentanol, 2-ethyl-1-butanol, 1-heptanol, 2-heptanol, 3-heptanol, 2-octanol, 2-ethyl-1-hexanol, 2-octanol, sec-octanol, 2-nonanol, 3,5,5-trimethyl-1-hexanol, 1-decanol, 2-decanol, isodecanol, 2-dodecanol, tridecanol, ethylene glycol, 1,3-propanediol, 2,3-butanediol, 1,5-pentanediol, 1,6-hexanediol, 1,7-heptanediol, 1,8-octanediol, cyclopentanol, cyclohexanol, cyclopentanemethanol, 3-cyclopentyl-1-propanol, 1-methylcyclopentanol, 3-methylcyclopentanol, 1,3-cyclopentanediol, 2-cyclohexylethanol, 1-cyclohexylethanol, 2,3-dimethylcyclohexanol, 1,3-cyclohexanediol, 1,4-cyclohexanediol, cycloheptanol, cyclooctanol, 1,5-decalindiol, 2,2-dichloroethanol, 1,1,1-trifluoroethanol, 2,2,3,3-tetrafluoro-1-propanol, 2,2,3,3,4,4,5,5-octafluoro-1-pentanol, 2-methoxyethanol, 2-ethoxyethanol, 2-propoxyethanol, 2-butoxyethanol, ethylene glycol monohexyl ether, ethylene glycol ethyl hexyl ether, 2-isobutoxyethanol, diethylene glycol, diethylene glycol monomethyl ether, diethylene glycol monoethyl ether, diethylene glycol monopropyl ether, diethylene glycol monobutyl ether, diethylene glycol monoisobutyl ether, diethylene glycol monohexyl ether, triethylene glycol, triethylene glycol monomethyl ether, triethylene glycol monoethyl ether, ethylene glycol monophenyl ether, tetraethylene glycol, terpinyl ethylene glycol ether, 3-ethoxy-1-propanol, 1-methoxy-2-propanol, propyleneglycol propyl ether, dipropylene glycol monomethyl ether, tripropylene glycol monomethyl ether, 1-phenoxy-2-propanol, 3-methoxy-1-butanol, 3-methoxy-3-methyl-1-butanol, 1,2-ethanediol, 1,2-propanediol, 1,3-propanediol, 1,2-butanediol, 1,3-butanediol, 1,4-butanediol, 2,3-butanediol, 2-butene-1,4-diol, 1,5-pentanediol, 2,4-pentanediol, 2,2-dimethyl-1,3-propanediol, 1,6-hexanediol, 2,5-hexanediol, 2-methyl-2,4-pentanediol, pinacol, 2,2-diethyl-1,3-propanediol, 2-ethyl-1,3-hexanediol, 2,5-dimethyl-3-hexyne-2,5-diol, 1,4-cyclohexanedimethanol, 3-ethoxy-1,2-propanediol, di(ethyleneglycol) ethylether, diethylene glycol, 2,4-dimethylphenol, 4-hydroxy-4-methyl-2-pentanone, allyl alcohol, crotyl alcohol, phenol, benzyl alcohol, furfuryl alcohol, tetrahydrofurfuryl alcohol, alpha-terpineol, tetrahydropyran-2-methanol, polyethylene glycol, glyceryl alpha-monomethyl ether, glyceryl alpha, gamma-dimethyl ether, glyceryl alpha-mono-n-butylether, glyceryl alpha-mono-isoamyl ether, and mixtures thereof.

Suitable carbonates include: dimethyl carbonate, diethyl carbonate, ethyl methyl carbonate, ethylene carbonate, propylene carbonate, and mixtures thereof.

In some embodiments, the fluid medium can function as a dispersant or stabilizing agent, as well as being the carrier vehicle for the particles. Solvent-based media that are useful as stabilizing agents include heteroaromatics, amines, thiols, thioethers, esters, amides, nitriles, amines, pyrrolidinones, ethers, alcohols, and mixtures thereof.

In some embodiments wherein the nanoparticles comprise an organic capping agent, suitable solvent-based media include: aromatics, heteroaromatics, alkanes, organic halides, ketones, esters, nitriles, amides, amines, thiols, thioethers, pyrrolidinones, ethers, $C_6$-$C_{25}$ alcohols, carbonates, and mixtures thereof. In some embodiments, the solvent-based medium comprises a mixture of thiols with aromatics or alkanes, wherein the wt % of thiol, based upon the total weight of the solvent mixture, is less than about 50 wt %, 40 wt %, 30 wt %, 25 wt %, 20 wt %, 15 wt %, 10 wt %, 7.5 wt %, 5 wt %, 4 wt %, 3 wt % or 2 wt %. In some embodiments, the alkyl thiol is selected from the group consisting of $C_1$-$C_8$ alkyl thiols.

In some embodiments wherein the nanoparticles comprise an inorganic capping agent, suitable solvent-based media include: water; water-soluble or water-miscible heteroaromatics, organic halides, and ketones; esters; nitriles; amides; amines; thiols; thioethers; pyrrolidinones; ethers; alcohols; carbonates; and mixtures thereof. In some embodiments, the heteroaromatic solvent, organic halide, ketone, ester, nitrile, amide, amine, thiol, thioether, pyrrolidinone, ether, alcohol or carbonate comprises one or more O-, N-, S-, or Se-based functional groups.

In addition to the fluid medium and the mixture of binary and/or ternary coated chalcogenide nanoparticles, the precursor ink can optionally further comprise additives, an elemental chalcogen, or mixtures thereof.

In some embodiments, the ink further comprises one or more additives selected from the group consisting of dispersants, surfactants, polymers, binders, cross-linking agents, emulsifiers, anti-foaming agents, dryers, fillers, extenders, thickening agents, film conditioners, anti-oxidants, flow agents, leveling agents, ligands, capping agents, defoamers, plasticizers, thixotropic agents, viscosity modifiers, dopants, and corrosion inhibitors. In some embodiments, additives are selected from the group consisting of capping agents, dopants, polymers, and surfactants. Typically, the additives comprise less than 20 wt %, or less than 10 wt %, or less than 5 wt %, or less than 2 wt %, or less than 1 wt % of the CZTS/Se precursor ink. Suitable capping agents comprise the stabilizing agents, including volatile stabilizing agents, described above.

Suitable polymeric additives include vinylpyrrolidone-vinylacetate copolymers and (meth)acrylate copolymers, including PVP/VA E-535 (International Specialty Products) and Elvacite® 2028 binder and Elvacite® 2008 binder (Lucite International, Inc.). In some embodiments, polymers can function as binders or dispersants. Suitable binders include polymers and oligomers with linear, branched, comb/brush, star, hyperbranched or dendritic structures and those with decomposition temperatures below 200° C. Decomposable polymers and oligomers useful herein include homo- and co-polymers of polyethers; homo- and co-polymers of polylactides; homo- and co-polymers of polycarbonates including, for example, Novomer PPC (Novomer, Inc.); homo- and co-polymers of 3-hydroxybutyric acid; homo and co-polymers of methacrylates; and mixtures thereof. If present, the polymeric or oligomeric binder is less than 20 wt %, or less than 10 wt %, or less than 5 wt %, or less than 2 wt %, or less than 1 wt % of the CZTS/Se precursor ink.

Suitable surfactants include siloxy-, fluoryl-, alkyl-, alkynyl-, and ammonium-substituted surfactants. Selection is typically based on observed coating and dispersion quality and the desired adhesion to the substrate. Suitable surfactants include Byk® surfactants (Byk Chemie), Zonyl® surfactants (DuPont), Triton® surfactants (Dow), Surfynol® surfactants (Air Products), Dynol® surfactants (Air Products), and Tego® surfactants (Evonik Industries AG). In certain embodiments, surfactants can function as coating aids, capping agents, or dispersants. A suitable low-boiling surfactant is Surfynol® 61 surfactant from Air Products. Cleavable surfactants useful herein as capping agents include Diels-Alder adducts, thiirane oxides, sulfones, acetals, ketals, carbonates, and ortho esters. Cleavable surfactants include: alkyl-substituted Diels Alder adducts, Diels Alder adducts of furans; thiirane oxide; alkyl thiirane oxides; aryl thiirane oxides; piperylene sulfone, butadiene sulfone, isoprene sulfone, 2,5-dihydro-3-thiophene carboxylic acid-1,1-dioxide-alkyl esters, alkyl acetals, alkyl ketals, alkyl 1,3-dioxolanes, alkyl 1,3-dioxanes, hydroxyl acetals, alkyl glucosides, ether acetals, polyoxyethylene acetals, alkyl carbonates, ether carbonates, polyoxyethylene carbonates, ortho esters of formates, alkyl ortho esters, ether ortho esters, and polyoxyethylene ortho esters.

The CZTS/Se precursor ink can also optionally comprise sodium salts and elemental chalcogens. In embodiments where sodium salts and/or elemental chalcogens are added to the CZTS/Se precursor ink, the ink is said to be "doped" with these additives. If present, the chalcogen is typically between 0.1 wt % and 10 wt % of the CZTS/Se precursor ink. Suitable dopants include sodium and alkali-containing compounds selected from the group consisting of: alkali compounds comprising N-, O-, C-, S-, or Se-based organic ligands, alkali sulfides, alkali selenides, and mixtures thereof. In other embodiments, the dopant comprises an alkali-containing compound selected from the group consisting of: alkali-compounds comprising amidos; alkoxides; acetylacetonates; carboxylates; hydrocarbyls; O-, N-, S-, Se-, halogen-, or tri (hydrocarbyl)silyl-substituted hydrocarbyls; thio- and selenolates; thio-, seleno-, and dithiocarboxylates; dithio-, diseleno-, and thioselenocarbamates; and dithioxanthogenates. Other suitable dopants include antimony chalcogenides selected from the group consisting of: antimony sulfide and antimony selenide.

In some embodiments, the ink comprises an elemental chalcogen selected from the group consisting of sulfur, selenium, and mixtures thereof. Useful forms of sulfur and selenium powders can be obtained from Sigma-Aldrich (St. Louis, Mo.) and Alfa Aesar (Ward Hill, Mass.). In some embodiments, the chalcogen powder is soluble in the fluid medium. If the chalcogen is not soluble in the fluid medium, its particle size can be 1 nm to 200 microns. In some embodiments, the particles have an average longest dimension of less than about 100 microns, 50 microns, 25 microns, 10 microns, 5 microns, 4 microns, 3 microns, 2 microns, 1.5 microns, 1.25 microns, 1.0 micron, 0.75 micron, 0.5 micron, 0.25 micron, or 0.1 micron. In some embodiments, the chalcogen particles are smaller than the thickness of the film that is to be formed. The chalcogen particles can be formed by ball milling, evaporation-condensation, melting and spraying ("atomization") to form droplets, or emulsification to form colloids.

Preparing the ink typically comprises mixing the components by any conventional method. In some embodiments, the preparation is conducted under an inert atmosphere. In some embodiments, the CZTS/Se precursor ink is prepared by dispersing in a fluid medium a mixture comprising the coated copper-containing, tin-containing, and zinc-containing nanoparticles. The dispersion of the coated nanoparticles in the fluid medium can be aided by agitation or sonication. In some embodiments, the coated copper-containing, tin-containing, and zinc-containing nanoparticles are separately dispersed in fluid media, and the resulting dispersions are then mixed.

In some embodiments, the CZTS/Se precursor ink comprises coated $Cu_2SnS/Se_3$ and ZnS/Se nanoparticles. In some embodiments, the molar ratio of $Cu_2SnS/Se_3$ and ZnS/Se is about 1:1, 1:1.1, 1:1.2, 1:1.3, 1:1.4, 1:1.5, or 1:1.6. The CZTS/Se precursor ink can further comprise coated SnS/Se nanoparticles in addition to the coated $Cu_2SnS/Se_3$ and ZnS/Se nanoparticles. In some embodiments, the molar ratio of $Cu_2SnS/Se_3$ to SnS/Se is about 1:0.025, 1:0.05, 1:0.075, 1:0.1, 1:0.11, 1:0.12, 1:0.13, 1:0.14, 1:0.15, 1:0.16, 1:0.17, 1:0.18, 1:0.19, 1:0.2, 1:0.25, or 1:0.3.

In some embodiments, the CZTS precursor ink comprises coated CuS/Se, ZnS/Se and SnS/Se nanoparticles in about a 2:1:1 molar ratio. In some embodiments, the molar ratio of CuS/Se to ZnS/Se is about 2:1, 2:1.1, 2:1.2, 2:1.3, 2:1.4, 2:1.5, or 2:1.6. In some embodiments, the molar ratio of CuS/Se to SnS/Se is about 2:1.025, 2:1.05, 2:1.075, 2:1.1, 2:1.11, 2:1.12, 2:1.13, 2:1.14, 2:1.15, 2:1.16, 2:1.17, 1:1.18, 2:1.19, 2:1.2, 2:1.25, 2:1.3, 2:1.35, 2:1.4, 2:1.45, or 2:1.5.

In some embodiments, the ratio of S:Se in the coated copper-containing, zinc-containing, and tin-containing nanoparticles of the precursor ink is 1:0 or 0:1 or about 0.9:0.1, 0.8:0.2, 0.7:0.3, 0.6:0.4, 0.5:0.5, 0.4:0.6, 0.3:0.7, 0.2:0.8, or 0.1:0.9.

In some embodiments, two or more inks are prepared separately, with each ink comprising coated copper-containing, zinc-containing, and tin-containing nanoparticles. The two or more inks can then be combined following mixing. This method is especially useful for controlling stoichiometry and obtaining CZTS/Se of high purity, as prior to mixing, separate films from each ink can be coated, annealed, and analyzed by XRD. The XRD results can guide the selection of the type and amount of each ink to be combined. For example, an ink yielding an annealed film of CZTS/Se with traces of copper sulfide and zinc sulfide can be combined with an ink yielding an annealed film of CZTS/Se with traces of tin sulfide, to form an ink that yields an annealed film comprising only CZTS/Se, as determined by XRD. In other embodiments, an ink comprising a complete set of reagents is combined with ink(s) comprising a partial set of reagents. As an example, an ink containing only a tin source can be added in varying amounts to an ink comprising a complete set of reagents, and the stoichiometry can be optimized based upon the resulting device performances of annealed films of the mixtures. Suitable tin sources include tin nanoparticles, tin-containing chalcogenide nanoparticles, and tin complexes. Suitable tin complexes include tin complexes of N-, O-, C-, S-, or Se-based organic ligands. In some embodiments, an ink comprising coated SnS nanoparticles is combined with an ink comprising coated $Cu_2SnS_3$ nanoparticles and coated ZnS nanoparticles.

The coated nanoparticles used in the CZTS/Se precursor ink can be synthesized by methods known in the art, including coprecipitation from solution, microemulsion, sol-gel processing, templated synthesis, and solvothermal methods.

Coated binary chalcogenide nanoparticles, including CuS, CuSe, ZnS, ZnSe and SnS, can be prepared from the corresponding metal salt by reaction of the metal salt with a source of sulfide or selenide in the presence of one or more stabilizing agents at a temperature between 0° C. and 500° C., or between 150° C. and 350° C. The binary chalcogenide nanoparticles can be isolated, for example, by precipitation by a non-solvent followed by centrifugation, and can be further purified by washing, or dissolving and re-precipitating. Suitable metal salts for this synthetic route include Cu(I), Cu(II), Zn(II), Sn(II) and Sn(IV) halides, acetates, nitrates, and 2,4-pentanedionates. Suitable chalcogen sources include elemental sulfur, elemental selenium, $Na_2S$, $Na_2Se$, thiourea, and thioacetamide. Suitable stabilizing agents include the capping agents disclosed above. In particular, suitable stabilizing agents include dodecylamine, tetradecyl amine, hexadecyl amine, octadecyl amine, oleylamine, trioctyl amine, trioctylphosphine oxide, other trialkylphosphine oxides, and trialkylphosphines.

$Cu_2S$ nanoparticles can be synthesized by a solvothermal process, in which the metal salt is dissolved in deionized water. A long-chain alkyl thiol or selenol (e.g., 1-dodecanethiol or 1-dodecaneselenol) can serve as both the sulfur source and a dispersant for nanoparticles. Some additional ligands, including acetate, chloride can be added in the form of an acid or a salt. The reaction is typically conducted at a temperature between 150° C. and 300° C. and at a pressure between 150 and 250 psig nitrogen. After cooling, the product can be isolated from the non-aqueous phase, for example, by precipitation using a non-solvent and filtration.

The binary chalcogenide nanoparticles can also be synthesized by an alternative solvothermal process in which the corresponding metal salt is dispersed along with thioacetamide, thiourea, selenoacetamide, selenourea or other source of sulfide or selenide ions and an organic stabilizing agent (e.g., a long-chain alkyl thiol or a long-chain alkyl amine) in a suitable solvent at a temperature between 150° C. and 300° C. The reaction is typically conducted at a pressure between 150 and 250 psig nitrogen. Suitable metal salts for this synthetic route include Cu(I), Cu(II), Zn(II), Sn(II) and Sn(IV) halides, acetates, nitrates, and 2,4-pentanedionates.

The resultant binary chalcogenide nanoparticles obtained from any of the three routes are coated with the organic stabilizing agent(s), as can be determined by secondary ion mass spectrometry and nuclear magnetic resonance spectroscopy. The structure of the inorganic crystalline core of the coated binary nanoparticles obtained can be determined by X-ray diffraction (XRD) and transmission electron microscopy (TEM) techniques.

Coated ternary chalcogenide nanoparticles containing two metals, e.g., $Cu_2SnS_3$, $Cu_4SnS_4$, or $Cu_2SnSe_3$ nanoparticles, can be prepared by reacting the corresponding metal salts and chalcogen in the presence of an amine and a second organic stabilizing agent at a temperature between 150° C. and 350° C. Suitable amines include dodecylamine, tetradecyl amine, hexadecyl amine, octadecyl amine, oleylamine, and trioctyl amine.

Alternatively, coated ternary chalcogenide nanoparticles can be synthesized by a solvothermal process in which the corresponding metal salts are dispersed along with a source of sulfide or selenide ions and a long-chain alkyl thiol in a suitable solvent at a temperature between 150° C. and 300° C. Suitable sources of sulfide ions include thioacetamide, thiourea, selenoacetamide and selenourea. Long-chain alkyl thiols include 1-dodecanethiol and 1-decanethiol. The reaction is typically conducted under 175 psig to 275 psig nitrogen.

The resultant ternary chalcogenide nanoparticles obtained from either route are coated with the organic stabilizing agent(s), as can be determined by secondary ion mass spectrometry and nuclear magnetic resonance spectroscopy. The structure of the inorganic core of the coated nanoparticles obtained can be determined by X-ray diffraction (XRD) spectroscopy and tunnel electron microscopy (TEM) techniques.

Coated chalcogenide nanoparticle can also be prepared that are stabilized with inorganic stabilizing agents. Such nanoparticles are dispersible, but contain essentially no carbon which might contaminate a CZTS/Se thin film.

The inorganic-stabilized chalcogenides can be prepared by a process comprising:

a) providing a first composition comprising a first solvent and a metal complex, and a second composition comprising a second solvent and a compound selected from the group consisting of sulfides, selenides, and tellurides, wherein the first and second solvents are immiscible;

b) combining the first and second compositions to give a third composition and agitating the third composition;

c) allowing the third composition to phase-separate to form a phase comprising the first solvent and a phase comprising the second solvent, and isolating the phase comprising the second solvent;

d) optionally adding a third solvent to the isolated phase comprising the second solvent to form a precipitate; and e) isolating the precipitate.

Combining the first and second compositions (as described in step b) can be carried out by simply pouring one composition into the other. The combined compositions do not form a homogeneous mixture, and the reaction of the metal complex and the sulfide, selenide and/or telluride is facilitated by vigorous agitation (e.g., stirring or shaking) for periods of less than 1 sec to a few tens of minutes depending on how vigorous the agitation is.

Next, the combined composition is allowed to phase-separate, and the phase comprising the second solvent is isolated. In some embodiments, addition of a third solvent to the isolated second phase precipitates the desired metal chalcogenide as chalcogenide-capped nanoparticles, which can be isolated by centrifugation or filtration. The isolated nanoparticles can optionally be washed with a solvent.

The first solvent is typically an organic-based solvent of lower polarity than the second solvent. In some embodiments, the first solvent has a Delta(P) of less than 8 on the Hansen scale. In some embodiments, the first solvent is selected from the group consisting of: xylene, toluene, pentane, 2-butanone, methyl t-butyl ether, hexane, heptane, ethyl ether, dichloromethane, 1,2-dichloroethane, cyclohexane, chloroform, carbon tetrachloride, butanol, benzene, and mixtures thereof.

The second solvent is typically water or an organic solvent with a Delta(P) of 8 or higher on the Hansen scale or with a dielectric constant of or 38 or higher. In some embodiments, the second solvent is selected from the group consisting of: water, formamide, dimethylformamide, dimethylsulfoxide, acetic acid, ethanolamine, propylene carbonate, ethylene carbonate, N,N-dimethylacetamide, N-methylformamide and mixtures thereof.

Suitable third solvents include: xylene, toluene, pentane, 2-butanone, methyl t-butyl ether, hexane, heptane, ethyl ether, dichloromethane, 1,2-dichloroethane, cyclohexane, chloroform, carbon tetrachloride, butanol, benzene, and mixtures thereof.

Suitable metal complexes comprise metals selected from the group consisting of Cu, Zn, and Sn.

Suitable metal complexes include metal complexes of nitrogen-, oxygen-, sulfur- or selenium-based organic ligands. In some embodiments, the organic ligands are selected from the group consisting of: amidos; alkoxides; acetylacetonates; carboxylates; thio- and selenolates; thio-, seleno-, and dithiocarboxylates; dithio-, diseleno-, and thioselenocarbamates; and dithioxanthogenates. Many of these are commercially available or readily synthesized by the addition of an amine, alcohol, or alkyl nucleophile to $CS_2$ or $CSe_2$ or CSSe. In some embodiments, suitable nitrogen-, oxygen-, sulfur- or selenium-based organic ligands contain 5 or more carbons.

Suitable sulfides, selenides, and tellurides for use in the synthesis of binary and ternary chalcogenide nanoparticles include Group 1 sulfides, selenides, and tellurides; Group 2 sulfides, selenides, and tellurides, and ammonium sulfides, selenides and tellerides. In some embodiments, suitable sulfides, selenides, and tellurides are selected from the group consisting of $Li_2S$, $Li_2Se$, $Li_2Te$, $Na_2S$, $Na_2Se$, $Na_2Te$, $K_2S$, $K_2Se$, $K_2Te$, MgS, MgSe, MgTe, CaS, CaSe, CaTe, $(NH_mR^1_{4-m})_2S$, $(NH_mR^1_{4-m})_2Se$, $(NH_mR^1_{4-m})_2Te$, and mixtures thereof, wherein $0 \le m \le 4$ and wherein each $R^1$ is independently selected from the group consisting of hydrogen, hydrocarbyl, and O-, N-, S-, Se-, halogen- or tri(hydrocarbyl) silyl-substituted hydrocarbyl. In some embodiments, suitable sulfides, selenides, and tellurides comprise $(NH_4)_2S$, $(NH_4)_2Se$, or $(NH_4)_2Te$. In some embodiments, suitable sulfides, selenides, and tellurides comprise a mixture of $Na_2(S,Se,Te)$ and $(NH_4)_2(S,Se,Te)$, wherein the ratio of Na to [Na+($NH_4$)] is less than 0.5 or 0.3 or 0.2 or 0.1, and wherein $Na_2(S,Se,Te)$ and $(NH_4)_2(S,Se,Te)$ independently encompass all possible combinations of $Na_2(S_rSe_sTe_t)$ and $(NH_4)_2(S_rSe_sTe_t)$ where $0 \le r \le 1$, $0 \le s \le 1$ $0 \le t \le 1$, and $r+s+t=1$.

Prior to formation of the CZTS/Se precursor ink, the coated binary and ternary chalcogenide nanoparticles can be further treated with an alternative stabilizing agent to replace the initial stabilizing agent(s) with the alternative stabilizing agent. This exchange can be carried out by suspending the initially formed coated nanoparticles in a fluid medium in the presence of the alternative stabilizing agent, followed by isolation of the coated nanoparticles. The nanoparticles obtained are coated with the alternative stabilizing agent.

In some embodiments, the initial stabilizing agent is replaced with an alternative stabilizing agent of lower molecular weight, higher volatility or lower decomposition temperature. Use of such alternative stabilizing agents as coating for the mixtures of coated nanoparticle chalcogenides can lead to annealed CZTS/Se films of higher purity and consequently better semiconductor properties. It is believed that CZTS/Se films with lower levels of carbon impurities derived from the stabilizing agent(s) are desirable. Suitable alternative stabilizing agents include: pyridine, pyrrolidone, methylpyridine, ethylpyridine, 2-mercaptopyridine, thiophene-2-ethylamine, tetramethylethylenediamine, t-butylpyridine, thiols, and alkyl thiols.

Another aspect of the invention is a process comprising disposing an ink onto a substrate to form a coated substrate, wherein the ink comprises:
a) a fluid medium;
b) coated copper-containing chalcogenide nanoparticles;
c) coated tin-containing chalcogenide nanoparticles; and
d) coated zinc-containing chalcogenide nanoparticles,
wherein the molar ratio of Cu:Zn:Sn is about 2:1:1 and the ratio of total chalcogen to (Cu+Zn+Sn) of the CZTS/Se precursor ink is at least about 1.

Another aspect of the invention provides a coated substrate comprising:
a) a substrate; and
b) at least one layer disposed on the substrate comprising:
  i) coated copper-containing chalcogenide nanoparticles;
  ii) coated tin-containing chalcogenide nanoparticles; and
  iii) coated zinc-containing chalcogenide nanoparticles,
    wherein the molar ratio of Cu:Zn:Sn is about 2:1:1 and the ratio of total chalcogen to (Cu+Zn+Sn) of the CZTS/Se precursor ink is at least about 1.

In some embodiments, the at least one layer of the coated substrate consists essentially of components (i)-(iii). In some embodiments, the at least one layer comprises an elemental chalcogen selected from the group consisting of sulfur, selenium, and mixtures thereof.

In some embodiments, the copper-containing chalcogenide is selected from the group consisting of $Cu_2S$, CuS, $Cu_2Se$, CuSe, $Cu_2(S,Se)$, Cu(S,Se), $Cu_2SnS_3$, $Cu_4SnS_4$, $Cu_2SnSe_3$, $Cu_2Sn(S,Se)_3$, and mixtures thereof. In some embodiments, the tin-containing chalcogenide is selected from the group consisting of $SnS_2$, SnS, $SnSe_2$, SnSe, $Sn(S,Se)_2$, Sn(S,Se), $Cu_2SnS_3$, $Cu_4SnS_4$, $Cu_2SnSe_3$, $Cu_2Sn(S,Se)_3$, and mixtures thereof. In some embodiments, the zinc-containing chalcogenide is selected from the group consisting of ZnS, ZnSe, Zn(S,Se), and mixtures thereof. In some embodiments, the copper-, tin-, and zinc-containing chalcogenides comprise: (a) CuS, SnS, and ZnS; (b) $Cu_2SnS_3$ and ZnS; (c) $Cu_2SnS_3$, ZnS, and SnS; or (d) $Cu_2SnS_3$, CuS, ZnS, and SnS. In some embodiments, the copper-, tin-, and zinc-containing chalcogenides consist essentially of: (a) CuS, SnS, and ZnS; (b) $Cu_2SnS_3$ and ZnS; (c) $Cu_2SnS_3$, ZnS, and SnS; or (d) $Cu_2SnS_3$, CuS, ZnS, and SnS.

The CZTS/Se precursor ink is deposited on a surface of a substrate by any of several conventional coating or printing techniques, e.g., spin-coating, doctor blade coating, spraying, dip-coating, rod-coating, drop-cast coating, wet coating, roller coating, slot-die coating, meyerbar coating, capillary coating, ink-jet printing, draw-down coating, ink-jet printing, contact printing, gravure printing, flexographic printing, and screen printing. The coating can be dried by evaporation, by applying vacuum, by heating, or by combinations thereof. In some embodiments, the substrate and disposed ink are heated at a temperature from 80-400° C., 80-350° C., 100-300° C., 175-400° C., 200-400° C., 250-400° C., 300-400° C., 120-250° C., or 150-190° C. to remove at least a portion of the solvent, if present, by-products, and volatile capping agents. In some embodiments, the drying step is carried out under an inert atmosphere. In some embodiments, the drying step is carried out under an atmosphere comprising oxygen. The drying step can be a separate, distinct step, or can occur as the substrate and precursor ink are heated in an annealing step.

The substrate can be rigid or flexible. In one embodiment, the substrate comprises: (i) a base; and (ii) optionally, an electrically conductive coating on the base. The base material is selected from the group consisting of glass, metals, ceramics, and polymeric films. Suitable base materials include metal foils, plastics, polymers, metalized plastics, glass, solar glass, low-iron glass, green glass, soda-lime glass, metalized glass, steel, stainless steel, aluminum, ceramics, metal plates, metalized ceramic plates, and metalized polymer plates. In some embodiments, the base material comprises a filled polymer (e.g., a polyimide and an inorganic filler). In some embodiments, the base material comprises a metal (e.g., stainless steel) coated with a thin insulating layer (e.g., alumina).

Suitable electrically conductive coatings include metal conductors, transparent conducting oxides, and organic conductors. Of particular interest are substrates of molybdenum-coated soda-lime glass, molybdenum-coated polyimide films, and molybdenum-coated polyimide films further comprising a thin layer (e.g., less than 100 angstroms in thickness) of a sodium compound (e.g., NaF, $Na_2S$, or $Na_2Se$).

In some embodiments, the molar ratio of Cu:Zn:Sn in the coating on the substrate is about is 2:1:1. In other embodiments, the molar ratio of Cu to (Zn+Sn) is less than one. In other embodiments, the molar ratio of Zn:Sn is greater than one.

Formation of CZTS/Se Films

In some embodiments, the coated substrate is heated at about 100-800° C., 200-800° C., 250-800° C., 300-800° C., 350-800° C., 400-800° C., 400-650° C., 450-600° C., 450-550° C., 450-525° C., 100-700° C., 200-650° C., 300-600° C., 350-575° C., or 350-525° C. In some embodiments, the coated substrate is heated for a time in the range of about 1 min to about 48 h; 1 min to about 30 min; 10 min to about 10 h; 15 min to about 5 h; 20 min to about 3 h; or, 30 min to about 2 h. Typically, the annealing comprises thermal processing, rapid thermal processing (RTP), rapid thermal annealing (RTA), pulsed thermal processing (PTP), laser beam exposure, heating via IR lamps, electron beam exposure, pulsed electron beam processing, heating via microwave irradiation, or combinations thereof. Herein, RTP refers to a technology that can be used in place of standard furnaces and involves single-wafer processing, and fast heating and cooling rates. RTA is a subset of RTP, and consists of unique heat treatments for different effects, including activation of dopants, changing substrate interfaces, densifying and changing states of films, repairing damage, and moving dopants. Rapid thermal anneals are performed using lamp-based heating, a hot chuck, or a hot plate. PTP involves thermally annealing structures at extremely high power densities for periods of very short duration, resulting, for example, in defect reduction. Similarly, pulsed electron beam processing uses a pulsed high energy electron beam with short pulse duration. Pulsed processing is useful for processing thin films on temperature-sensitive substrates. The duration of the pulse is so short that little energy is transferred to the substrate, leaving it undamaged.

In some embodiments, the annealing is carried out under an atmosphere comprising: an inert gas (nitrogen or a Group VIIIA gas, particularly argon); optionally hydrogen; optionally, a chalcogen source such as selenium vapor, sulfur vapor, hydrogen sulfide, hydrogen selenide, diethyl selenide, or mixtures thereof; and, optionally, a tin source. Suitable sources of tin include elemental tin, including tin powder, tin particles, and molten tin; and tin chalcogenides, including $SnS_2$, $SnSe_2$, $Sn(S/Se)_2$, SnS, SnSe, and Sn(S/Se). In some embodiments, at least a portion of the chalcogen present in the coating (e.g., S) can be exchanged (e.g., S can be replaced by Se) by conducting the annealing step in the presence of a different chalcogen (e.g., Se). In some embodiments, annealings are conducted under a combination of atmospheres. For example, a first annealing is carried out under an inert atmosphere and a second annealing is carried out in an atmosphere comprising an inert gas and a chalcogen source as described above, or vice versa. In some embodiments, the annealing is conducted with slow heating and/or cooling steps, e.g., temperature ramps and declines of less than about 15° C. per min, 10° C. per min, 5° C. per min, 2° C. per min, or 1° C. per min. In other embodiments, the annealing is conducted with rapid and/or cooling steps, e.g., temperature ramps and declines of greater than about 15° C. per min, 20° C. per min, 30° C. per min, 45° C. per min, or 60° C. per min.

By varying the ink concentration and/or coating technique and temperature, layers of varying thickness can be coated in a single coating step. In some embodiments, the coating thickness can be increased by repeating the coating and drying steps. These multiple coatings can be conducted with the same ink or with different inks. As described above, wherein two or more inks are mixed, the coating of multiple layers with different inks can be used to fine-tune stoichiometry and purity of the CZTS/Se films by fine-tuning Cu to Zn to Sn ratios. Soft-bake and annealing steps can be carried out between the coating of multiple layers. In these instances, the coating of multiple layers with different inks can be used to create gradient layers, such as layers that vary in the S/Se ratio. The coating of multiple layers can also be used to fill in voids in the at least one layer and planarize or create an underlayer to the at least one layer, as described above.

The annealed film typically has an increased density and/or reduced thickness versus that of the wet precursor layer. In some embodiments, the film thicknesses of the dried and annealed coatings are 0.1-200 microns; 0.1-100 microns; 0.1-50 microns; 0.1-25 microns; 0.1-10 microns; 0.1-5 microns; 0.1-3 microns; 0.3-3 microns; or 0.5-2 microns.

Application of multiple coatings, washing the coating, and/or exchanging capping agents can serve to reduce carbon-based impurities in the coatings and films. For example, after an initial coating, the coated substrate can be dried and then a second coating can be applied and coated by spin-coating. The spin-coating step can wash organics out of the first coating. Alternatively, the coated film can be soaked in a solvent and then spun-coated to wash out the organics. Examples of useful solvents for removing organics in the coatings include alcohols, e.g., methanol or ethanol, and hydrocarbons, e.g., toluene. As another example, dip-coating of the substrate into the ink can be alternated with dip-coating of the coated substrate into a solvent bath to remove impurities and capping agents. Removal of non-volatile capping agents from the coating can be further facilitated by exchanging these capping agents with volatile capping agents. For example, the volatile capping agent can be used as the washing solution or as a component in a bath. In some embodiments, a layer of a coated substrate comprising a first capping agent is contacted with a second capping agent, thereby replacing the first capping agent with the second capping agent to form a second coated substrate. Advantages of this method include film densification along with lower levels of carbon-based impurities in the film, particularly if and when it is later annealed. Alternatively, binary sulfides and other impurities can be removed by etching the annealed film using techniques such as those used for CIGS films.

An annealed film comprising CZTS/Se is produced by the above annealing processes. In some embodiments, the molar ratio of Cu:Zn:Sn is about 2:1:1 in the annealed film. In some embodiments, the molar ratio of Cu to (Zn+Sn) is less than one in the annealed film. In some embodiments, a molar ratio of Zn to Sn is greater than one in an annealed film comprising CZTS/Se.

In some embodiments, the annealed CZTS/Se film comprises a large-grain CZTS/Se layer and a fine-grain layer, wherein the fine-grain layer comprises nanoparticles of CZTS/Se and ZnS/Se embedded in a carbon matrix.

Another aspect of this invention is a CZTS/Se film comprising adjacent first and second layers, wherein:
a) the first layer comprises CZTS/Se grains characterized by an average diameter of at least 0.3 microns; and
b) the second layer comprises CZTS/Se and ZnS/Se nanoparticles embedded in a carbon matrix.

In some embodiments, the average thickness of the first layer is at least about 0.5, 1.0, 1.5, 2.0, 2.5, or 3.0 microns. In some embodiments, the average thickness of the second layer is less than about 3.0, 2.5, 2.0, 1.5, 1.0, 0.5, 0.4, 0.3, 0.2 or 0.1 microns.

In some embodiments, the CZTS/Se grains of the first layer are characterized by an average diameter of 0.5-20 microns, 0.5-10 microns, 0.5-5 microns, 0.5 to 3 microns, 0.5 to 2 microns, 1-10 microns, 1-5 microns, 1-3 microns, or 1-2 microns. In some embodiments, the molar ratio of Cu:Zn:Sn is about 2:1:1 in the CZTS/Se grains of the first layer. In some embodiments, the molar ratio of Cu to (Zn+Sn) is less than one in the CZTS/Se grains of the first layer. In some embodiments, a molar ratio of Zn to Sn is greater than one in the CZTS/Se grains of the first layer. In some embodiments, the first layer consists essentially of CZTS/Se grains.

In some embodiments, the second layer further comprises nanoparticles of $Cu_2S/Se$, CuS/Se, $Cu_2Sn(S/Se)_3$, SnS/Se, $Sn(S/Se)_2$ or mixtures thereof, embedded in the carbon matrix. In some embodiments the second layer comprises at least 5, 10, 15, 20, 30, 40, 50, 60, 70, 80, or 90 atom percent carbon, as determined by Auger depth profiling. In some embodiments, the second layer consists essentially of a carbon matrix with embedded CZTS/Se and ZnS/Se nanoparticles.

Another aspect of this invention provides processes for manufacturing thin-film photovoltaic cells. The photovoltaic cell can be a single-junction cell or in tandem with other cells.

A typical photovoltaic cell includes a substrate (e.g., soda-lime glass), a back contact layer (e.g., molybdenum), an absorber layer (also referred to as the first semiconductor layer), a buffer layer (also referred to as the second semiconductor layer, which is typically selected from CdS, Zn (S, O, OH), cadmium zinc sulfides, $In(OH)_3$, $In_2S_3$, ZnSe, zinc indium selenides, indium selenides, zinc magnesium oxides, or $SnO_2$), and a top contact layer (e.g., zinc oxide doped with aluminum). The photovoltaic cell can also include an electrical contact of electrode pad on the top contact layer, and an anti-reflective (AR) coating on the front (light-facing) surface of the substrate to enhance the transmission of light into the semiconductor layer.

One aspect of this invention provides processes for forming photovoltaic cells comprising:
a) coating a photovoltaic cell substrate with a composition comprising:
  i) a fluid medium;
  ii) coated copper-containing chalcogenide nanoparticles;
  iii) coated tin-containing chalcogenide nanoparticles; and
  iv) coated zinc-containing chalcogenide nanoparticles,
    wherein the molar ratio of Cu:Zn:Sn is about 2:1:1 and the ratio of total chalcogen to (Cu+Zn+Sn) of the CZTS/Se precursor ink is at least about 1;
b) heating the coated photovoltaic cell substrate at a temperature between 400° C. and 800° C. to form an annealed CZTS/Se thin film on the photovoltaic cell substrate;
c) optionally repeating steps a) and b) to form a CZTS/Se film of the desired thickness;
d) depositing a buffer layer onto the CZTS/Se layer; and
e) depositing a top contact layer onto the buffer layer.

Another aspect of this invention is a photovoltaic cell comprising a CZTS/Se film comprising adjacent first and second layers, wherein:
a) the first layer comprises CZTS/Se grains characterized by an average diameter of at least 0.3 microns; and
b) the second layer comprises CZTS/Se and ZnS/Se nanoparticles embedded in a carbon matrix.

Suitable substrate materials for the photovoltaic cell substrate include glass, metals or polymers. The substrate can be rigid or flexible. If the substrate material is not itself a conductor (e.g., a metal), the substrate comprises a metal coating or metal layer. Suitable substrate materials include soda-lime glass, polyimide films, solar glass, low-iron glass, green glass, steel, stainless steel, aluminum, and ceramics. Suitable photovoltaic cell substrates include molybdenum-coated soda-lime glass, molybdenum-coated polyimide films, molybdenum-coated polyimide films with a thin layer of a sodium compound (e.g., NaF, $Na_2S$, or $Na_2Se$), metalized ceramic plates, metalized polymer plates, and metalized glass plates. The photovoltaic cell substrate can also comprise an interfacial layer to promote adhesion between the substrate material and metal layer. Suitable interfacial layers can comprise metals (e.g., V, W, Cr), glass, or compounds of nitrides, oxides, and/or carbides.

Typical photovoltaic cell substrates are glass or plastic, coated on one side with a conductive material, e.g., a metal. In one embodiment, the substrate is molybdenum-coated glass.

Depositing and annealing the CZTS/Se layer on the photovoltaic cell substrate can be carried out as described above.

The buffer layer typically comprises an inorganic material such as CdS, ZnS, zinc hydroxide, Zn (S, O, OH), cadmium zinc sulfides, $In(OH)_3$, $In_2S_3$, ZnSe, zinc indium selenides, indium selenides, zinc magnesium oxides, or n-type organic materials, or combinations thereof. Layers of these materials can be deposited by chemical bath deposition, atomic layer deposition, coevaporation, sputtering or chemical surface deposition to a thickness of about 2 nm to about 1000 nm, or from about 5 nm to about 500 nm, or from about 10 nm to about 300 nm, or 40 nm to 100 nm, or 50 nm to 80 nm.

The top contact layer is typically a transparent conducting oxide, e.g., zinc oxide, aluminum-doped zinc oxide, indium tin oxide, or cadmium stannate. Suitable deposition techniques include sputtering, evaporation, chemical bath deposition, electroplating, chemical vapor deposition, physical vapor deposition, and atomic layer deposition. Alternatively, the top contact layer can comprise a transparent conductive polymeric layer, e.g., poly-3,4-ethylenedioxythiophene (PEDOT) doped with poly(styrenesulfonate) (PSS), which can be deposited by standard methods, including spin coating, dip-coating or spray coating. In some embodiments, the PEDOT is treated to remove acidic components to reduce the potential of acid-induced degradation of the photovoltaic cell components.

In one embodiment, the photovoltaic cell substrate coated with a CZTS/Se film is placed in a cadmium sulfide bath to deposit a layer of CdS. Alternatively, CdS can be deposited on the CZTS/Se film by placing the CZTS/Se coated substrate in a cadmium iodide bath containing thiourea.

In one embodiment, the photovoltaic cell is fabricated using a sputtered layer of insulating zinc oxide in place of CdS. In some embodiments, CdS and ZnO layers are both present in the photovoltaic cell; in other embodiments, only one of CdS and ZnO is present.

In some embodiments, a layer of a sodium compound (e.g., NaF, $Na_2S$, or $Na_2Se$) is formed above and/or below the CZTS/Se layer. The layer of the sodium compound can be applied by sputtering, evaporation, chemical bath deposition, electroplating, sol-gel based coatings, spray coating, chemical vapor deposition, physical vapor deposition, or atomic layer deposition.

One advantage of using mixtures of coated nanoparticle chalcogenides to form the precursor ink is that the coated nanoparticle chalcogenides are easily prepared. Another advantage is that the mixtures form stable dispersions that can be stored for long periods without settling or agglomeration of particles. Another advantage is that the overall ratios of copper, zinc, tin and chalcogenide in the precursor ink can be easily varied to achieve optimum performance of the photovoltaic cell. Another advantage is that the nanoparticle mixtures can be annealed at lower temperature than mixtures of larger particles, allowing the use of a wider range of substrates for the photovoltaic cells. Another advantage is that the dense packing of the nanoparticles leads a dense and smooth film, which is hard to achieve with larger particles.

EXAMPLES

General

All metal salts and reagents were obtained from commercial sources, and used as received, unless otherwise noted. Whatman® Puradisc™ 25 GD 1.0 μm GMF-150 filter media with polypropylene housing were used for filtration of nanoparticle dispersions.

Annealings were carried out in an argon atmosphere comprising selenium. Annealings were carried out in a single-zone Lindberg/Blue (Ashville, N.C.) tube furnace equipped with an external temperature controller and a two-inch quartz tube. The coated substrates were placed inside of a graphite box (Industrial Graphite Sales, Harvard, Ill.) with a lid with a center hole of 1 mm in diameter. The box dimensions were 5" length×1.4" width×0.625" height with a wall and lid thickness of 0.125". The selenium was either placed in small ceramic boats within the graphite box or directly on the floor of the graphite box. Vacuum was applied to the tube for 10-15 min, followed by an argon purge for 10-15 min. This process was carried out three times. A gas inlet and outlet were located at opposite ends of the tube, and the tube was purged with the inert gas while heating and cooling.

Mo-Sputtered SLG Substrates.

Mo-sputtered SLG substrates were purchased from Thin Film Devices, Inc. (Anaheim, Calif.) with a 750 nm layer of Mo on Pilkington Optifloat™ Clear 3.2 mm glass (Pilkington North America, Inc., Toledo, Ohio).

Flexible Substrate. A foil sheet of 430 stainless steel from ATI was cleaned with dichloromethane. Then the foil was rod-coated with a 0.5 M borosilicate glass sol-gel solution containing 14 wt % Na. The coating process used a #40 bar on a Cheminstrument® motorized drawdown coater at room temperature in a clean room environment (class 100). The coated substrate was then dried at 150° C. for 1 min to form a dried glass precursor layer on the annealed stainless steel substrate. After drying, the coated substrate was fired in an air box furnace to 500° C. for 5 min. The final glass layer had a thickness of 230 nm. On top of the glass layer, a 600 nm thick Mo layer was deposited by direct current sputtering. Before coating with the CZTS precursor ink, the flexible substrate was rinsed in de-ionized water, acetone, and isopropyl alcohol, then blown dry with $N_2$.

Cadmium Sulfide Deposition.

The samples to be coated were first soaked in deionized water for 5 min at room temperature. Deionized water (150 mL), 28% ammonium hydroxide (28 mL), and 0.015 mol/L $CdSO_4$ solution (22 mL) were mixed at room temperature and then quickly poured into a double-walled beaker (with 65° C. water circulating between the walls). The solution was continuously stirred at 170 rpm with a magnetic stir bar. Immediately after the mixed solution was poured into the double-walled beaker, the samples were transferred into the bath. After the samples were submerged for 1 min, 22 mL of 0.75 mol/L thiourea solution was added. After 11 min, the samples were removed from the bath, rinsed with deionized water, and dried under a nitrogen stream. Then the samples were placed on a hot plate at 200° C. under a nitrogen atmosphere for 2 min. Where noted, a piece of gold foil was kept in the bath throughout the chemical bath deposition process.

Insulating ZnO (i-ZnO) and ITO Transparent Conductor Deposition.

A transparent conductor was sputtered on top of the CdS with the following structure: 50 nm of insulating ZnO [100 W RF, 20 mTorr (19.9 mTorr Ar+0.1 mTorr $O_2$)], followed by 250 nm of ITO [100 W RF, 12 mTorr (12 mTorr Ar+5×10$^{-6}$ Torr $O_2$)]. The sheet resistivity of the resulting ITO layer was approximately 30 ohms per square.

Deposition of Silver Lines.

Silver was deposited at 150 WDC, 5 mTorr, 20 sccm Ar, with a target thickness of 750 nm.

Indium Electrodes.

The CZTS/Se, CdS, i-ZnO, and ITO layers around the devices were removed by scribing. Indium electrodes were then applied onto the Mo substrates by using a solder tip at temperatures between 150 and 310° C., typically 210° C.

IV Analysis.

Current (I) versus voltage (V) measurements were performed on the samples using two Agilent 5281B precision medium power SMUs in a E5270B mainframe in a four point probe configuration. Samples were illuminated with an Oriel 81150 solar simulator under 1 sun AM 1.5 G. The efficiencies reported below are for the entire cell, unless specified as active-area efficiencies. Active-area efficiencies were determined by subtracting the area shaded by silver lines from the total area of the device.

XAS Analysis.

XANES spectroscopy at the Cu, Zn and Sn K-edges were carried out at the Advanced Photon Source at the Argonne National Laboratory. Data were collected in fluorescence geometry at beamline 5BMD, DND-CAT. Thin-film samples were presented to the incident x-ray beam as made. An Oxford spectroscopy-grade ion chamber was used to determine the X-ray incident intensity ($I_0$). The $I_0$ detector was filled with 570 Torr of $N_2$ and 20 Torr of Ar. The fluorescence detector was a Lytle Cell filled with Xe installed perpendicular to the beam propagation direction. Data were collected from 8879 eV to 9954 eV for the Cu edge. The high final energy was used in order to capture a portion of the Zn edge in the same data set, to allow edge step ratio determination as an estimate of Cu:Zn ratio in the film. The Zn edge data were collected over the range 9557 eV to 10,404 eV. Sn edge data covered the range of 29,000 eV to 29,750 eV. The data energy scales were calibrated based on data from metal reference foils collected prior to sample data collection. A second order background was subtracted and the spectra were normalized. Data from several Cu, Zn and Sn sulfide, selenide, and oxide standards ($Cu_2ZnSnS_4$, $Cu_2ZnSnSe_4$, $Cu_2SnS_3$, CuS, $Cu_2S$, CuSe, $Cu_2Se$, CuO, $Cu_2O$, ZnS, ZnSe, ZnO, SnS, SnSe, SnO and $SnO_2$) were obtained under the same conditions. Non-linear least squares fitting of a linear combination of the appropriate standards to the spectra obtained from the samples yielded the phase distribution for each element.

XRD Analysis.

Powder X-ray diffraction was used for the identification of crystalline phases. Data were obtained with a Philips X'PERT automated powder diffractometer, Model 3040. The diffractometer was equipped with automatic variable anti-scatter and divergence slits, X'Celerator RTMS detector, and Ni filter. The radiation was CuK(alpha) (45 kV, 40 mA). Data were collected at room temperature from 4 to 120°. 2-theta, using a continuous scan with an equivalent step size of 0.02°, and a count time of from 80-240 sec per step in theta-theta geometry. Thin film samples were presented to the X-ray beam as made. MDI/Jade software version 9.1 was used with the International Committee for Diffraction Data database PDF4+2008 for phase identification and data analysis.

Synthesis of Coated ZnS Nanoparticles.

A solution of $ZnCl_2$ (5.72 g, 42 mmol) and trioctylphosphine oxide (48.7 g, 126.4 mmol) in 150 mL of oleylamine was heated at 170° C. under a nitrogen atmosphere with continuous magnetic stirring for 1 h, followed by the rapid addition of sulfur (1.613 g, 50.4 mmol) dissolved in 30 mL of oleylamine. The reaction mixture was heated and maintained at 320° C. for 75 min and then cooled in the air for 3 min, then in tap water for 1 min, and then in ice-water until it reached thermal equilibrium with the ice-water bath.

Synthesis of Coated SnS Nanoparticles.

A solution of tin chloride (10.42 g, 40 mmol) and trioctylphosphine oxide (46.4 g, 120 mmol) in 150 mL of oleylamine was heated at 220° C. under a nitrogen atmosphere with continuous magnetic stirring for 30 min, followed by the rapid addition of sulfur (1.536 g, 48 mmol) dissolved in 30 mL of oleylamine. The reaction mixture was maintained at 220° C. for 5 min and then cooled down in tap water for 1 min, and then in ice-water until it reached thermal equilibrium with the ice-water bath.

Synthesis of Coated $Cu_2SnS_3$ Nanoparticles.

A solution of CuCl (3.96 g, 40 mmol), $SnCl_4$ (5.21 g, 20 mmol), and trioctylphosphine oxide (46.4 g, 120 mmol) in 150 mL of oleylamine was heated at 260° C. under a nitrogen atmosphere with continuous mechanical stirring for 30 min, followed by the addition of sulfur (1.92 g, 60 mmol) dissolved in 30 mL of oleylamine. The reaction mixture was stirred at 260° C. for 3 minutes and then cooled down in tap water for 1 min, and then in ice-water until it reached thermal equilibrium with the ice-water bath.

Isolation of Coated ZnS SnS and $Cu_2SnS_3$ Nanoparticles.

Following the above syntheses, hexane (180 mL) was added to disperse the particles. Ethanol (360 mL) was added to flocculate the particles, which were then collected through centrifugation and decanting the supernatant. The synthesized nanoparticles were dried in vacuum overnight.

Purification of Coated ZnS SnS and $Cu_2SnS_3$ Nanoparticles.

Following isolation, further purification of the nanoparticles was carried out as follows: 10 mL of hexane was added to each gram of dried product to disperse the particles. Then 30 mL of ethanol was added to flocculate the particles. The particles were collected through centrifugation and decanting the supernatant. This dispersion-flocculation-collection process was carried out twice for the ZnS nanoparticles and once for the SnS and $Cu_2SnS_3$ nanoparticles, with the exceptions of Examples 1B, 1C and 1D, where it was carried out three times for the ZnS nanoparticles and twice for the SnS and $Cu_2SnS_3$ nanoparticles.

The ZnS sphalerite structure was determined by XRD. The particles were close to spherical in shape with 10 nm diameter. According to XAS analysis, the composition of the particles was ~87% ZnS and 13% SnS.

XRD analysis showed that SnS was the major product with minor amounts of $SnS_2$ also present. According to XAS analysis, the composition of the particles was 91% SnS and 9% $SnO_2$.

The $Cu_2SnS_3$ structure was determined by XRD. The particles were irregular in shape with longest dimensions ranging from 5 nm to 25 nm. The ICP-AES results showed that the Cu/Sn/S atomic ratio is approximately 3/1/4, which suggests the existence of some copper-containing impurities. According to XAS analysis, the copper in the particles was present as 39% CTS and 61% CuS, while the tin in the particles was present as 95% tin (IV) sulfides (CTS and $SnS_2$) and 5% $SnO_2$.

Example 1

Examples 1A-1G illustrate the preparation of CZTS precursor inks in 1-hexanethiol, 1-butanethiol, and 2% 1-butanethiol in toluene using coated $Cu_2SnS_3$, coated SnS, and coated ZnS nanoparticles. Examples 1B-1D illustrate the preparation of CZTS precursor inks with varying tin concentrations: Three CZTS precursor inks were made by mixing the $Cu_2SnS_3$ and ZnS dispersions together at a constant volume ratio of 1.9, while varying the amount of SnS dispersion added.

Example 1A

A CZTS precursor ink was prepared by dispersing coated $Cu_2SnS_3$ nanoparticles, coated SnS nanoparticles, and coated ZnS nanoparticles in 1-hexanethiol. The three types of nanoparticles, which were synthesized and purified according to the above procedures, were individually dispersed in 1-hexanethiol at 200 mg nanoparticles per mL of 1-hexanethiol by sonication for 10 min. Horn sonication was applied with a Misonix S-4000 sonicator (by Qsonica, LLC, Newtown, Conn.) with amplitude 30. The resulting three dispersions were then individually filtered with a 1 micron filter. The CZTS precursor ink was made by mixing the three dispersions at 11.0% (by volume) SnS dispersion, 30.7% (by volume) ZnS dispersion, and 58.3% (by volume) $Cu_2SnS_3$ dispersion, followed by bath sonication for 20 min.

Example 1B

A CZTS precursor ink was prepared according to the procedure of Example 1A with 0.0% SnS dispersion, 34.5% (by volume) ZnS dispersion, and 65.5% (by volume) $Cu_2SnS_3$ dispersion.

Example 1C

A CZTS precursor ink was prepared according to the procedure of Example 1A with 5.0% (by volume) SnS dispersion, 32.8% (by volume) ZnS dispersion, and 62.2% (by volume) $Cu_2SnS_3$ dispersion.

Example 1D

A CZTS precursor ink was prepared according to the procedure of Example 1A with 10.0% (by volume) SnS dispersion, 31.0% (by volume) ZnS dispersion, and 59.0% (by volume) $Cu_2SnS_3$ dispersion.

Example 1E

A CZTS precursor ink was prepared according to the procedure of Example 1D using 1-butanethiol in place of 1-hexanethiol.

Example 1F

A CZTS precursor ink was prepared by dispersing coated $Cu_2SnS_3$ nanoparticles, coated SnS nanoparticles, and coated ZnS nanoparticles in a mixture of 2% 1-butanethiol and 98% toluene. The three types of nanoparticles were individually dispersed at 200 mg nanoparticles per mL of solvent by sonication for 30 min. Horn sonication was applied with a Vibra Cell Horn Sonicator (by Sonics and Materials, Inc., Newtown, Conn.) with amplitude 30. The resulting three dispersions were then individually filtered with a 1 micron filter. The CZTS precursor ink was made by mixing the three dispersions at 11.0% (by volume; 0.73 mL) SnS dispersion, 30.7% (by volume; 2.03 mL) ZnS dispersion, and 58.3% (by volume; 3.85 mL) $Cu_2SnS_3$ dispersion, followed by bath sonication for 10 min.

Example 1G

A CZTS precursor ink was prepared according to the procedure of Example 1F using 1-butanethiol in place of 2% 1-butanethiol in toluene.

Example 1H

A CZTS precursor ink was prepared according to the procedure of Example 1A with 14.0% (by volume) SnS dispersion, 29.3% (by volume) ZnS dispersion, and 56.7% (by volume) $Cu_2SnS_3$ dispersion.

Example 1I

A CZTS precursor ink was prepared as in Example 1F, except using 0.44 mL SnS dispersion, 1.23 mL ZnS dispersion, and 2.33 mL CTS dispersion.

Example 2

Examples 2A-2I illustrate the preparation of CZTS precursor films on Mo-coated glass substrates. Example 2J illustrates the preparation of a CZTS precursor film on a flexible substrate.

Example 2A

A portion of the CZTS precursor ink of Example 1A was deposited and spin-coated onto a molybdenum-coated glass substrate with a three-step spinning procedure as follows: (1) ramp to 1000 rpm and spin at 1000 rpm for 15 sec, (2) then spin at 1500 rpm for 20 sec, and (3) finally, spin at 3000 rpm for 5 sec. After spin-coating, the sample was soft-baked in the air on a hot plate at 175° C. for 2 min and then at 350° C. for 2 min. The deposition, spin-coating, and soft-baking procedures were repeated 4 additional times to yield a 5-layer coating.

Example 2B

A portion of the CZTS precursor ink of Example 1B was deposited and spin-coated onto a molybdenum-coated glass substrate with a ramp rate of 1000 rpm and spinning speed of 3000 rpm for 20 sec. After spin-coating, the sample was soft-baked in the air on a hot plate at 175° C. for 2 min and then at 350° C. for 2 min, followed by 175° C. for 2 min. The deposition, spin-coating and soft-baking procedures were repeated 7 additional times to yield an 8-layer coating.

Example 2C

A portion of the CZTS precursor ink of Example 1C was deposited and spin-coated onto a molybdenum-coated glass substrate according to the procedure of Example 2B.

Example 2D

A portion of the CZTS precursor ink of Example 1D was deposited and spin-coated onto a molybdenum-coated glass substrate according to the procedure of Example 2B.

Example 2E

A portion of the CZTS precursor ink of Example 1E was deposited and spin-coated onto a molybdenum-coated glass substrate according to the procedure of Example 2B, with the exception that the deposition, spin-coating and soft-baking procedures were repeated one additional time to yield a 2-layer coating.

Example 2F

A portion of the CZTS precursor ink of Example 1E was deposited and spin-coated onto a molybdenum-coated glass substrate according to the procedure of Example 2B, with the exception that the deposition, spin-coating and soft-baking procedures were repeated three additional times to yield a 4-layer coating.

Example 2G

A portion of the CZTS precursor ink of Example 1F was deposited and spin-coated onto a molybdenum-coated glass substrate according to the procedure of Example 2A, with the exception that the deposition, spin-coating and soft-baking procedures were repeated five additional times to yield a 6-layer coating. The coated substrate was allowed to cool for a minimum of 2 min between each coating, and the precursor inks were vortex-mixed for 10 sec before each coating.

Example 2H

A portion of the CZTS precursor ink of Example 1G was deposited and spin-coated onto a molybdenum-coated glass substrate according to the procedure of Example 2G.

Example 2I

A portion of the CZTS precursor ink of Example 1H was deposited and spin-coated onto a molybdenum-coated glass substrate according to the procedure of Example 2A, with the exception that the deposition, spin-coating, and soft-baking procedures were repeated 7 additional times to yield an 8-layer coating. Also, after spin-coating each layer, the sample was soft-baked in the air on a hot plate at 150° C. for 2 min and then at 300° C. for 2 min.

Example 2J

A CZTS precursor ink prepared as described in Example 1I was applied to a Mo/glass/stainless steel flexible substrate, then spin-coated at 1000 rpm for 10 sec, 1500 rpm for 15 sec, and 3000 rpm for 5 sec. The coated substrate was soft-baked on a hot-plate in air at 175° C. for 2 min, 300° C. for 2 min, and 175° C. for 2 min, and then set aside to cool. After a minimum of 2 min cooling, the coating process was repeated six additional times for a total of 7 coats. The precursor inks were vortex-mixed for 10 sec before each coating.

Example 3

Examples 3A-3J illustrate annealing processes to form CZTS/Se films.

Example 3A

A CZTS precursor-coated substrate was prepared as described in Example 2A. The coated substrate was placed in a graphite box containing 150 mg of elemental selenium in a small ceramic boat and heated at 560° C. for 20 min. XRD on a similarly prepared sample, except with 9 coated layers, showed that the resulting article contained CZTS/Se (with 82.8% of sulfur replaced with selenium) and molybdenum.

Example 3B

A CZTS precursor-coated substrate was prepared as described in Example 2B. The coated substrate was placed in a graphite box containing 200 mg of elemental selenium, which was located on the floor of the box, and heated at 560° C. for 20 min. According to the XRD, the resulting article contained CZTS/Se (with 82.5% of sulfur replaced with selenium), molybdenum, and molybdenum selenide.

Example 3C

A CZTS precursor-coated substrate was prepared as described in Example 2C and annealed according to the procedure of Example 3B. According to the XRD, the resulting article contained CZTS/Se (with 86.4% of sulfur replaced with selenium), molybdenum, and molybdenum selenide.

Example 3D

A CZTS precursor-coated substrate was prepared as described in Example 2D and annealed according to the procedure of Example 3B. According to the XRD, the resulting article contained CZTS/Se (with 82.7% of sulfur replaced with selenium), molybdenum, and molybdenum selenide.

Example 3E

A CZTS precursor-coated substrate was prepared as described in Example 2E and annealed according to the procedure of Example 3B. According to the XRD, the resulting article contained CZTS/Se (with 95.2% of sulfur replaced with selenium), molybdenum, and molybdenum selenide.

Example 3F

A CZTS precursor-coated substrate was prepared as described in Example 2F and annealed according to the procedure of Example 3B. According to the XRD, the resulting article contained CZTS/Se (with 89.1% of sulfur replaced with selenium), molybdenum, and molybdenum selenide.

Example 3G

A CZTS precursor-coated substrate was prepared as described in Example 2G and annealed according to the procedure of Example 3A. According to the XRD, the resulting article contains CZTS/Se (with 87.7% of sulfur replaced with selenium), molybdenum, and molybdenum selenide.

Example 3H

A CZTS precursor-coated substrate was prepared as described in Example 2H and annealed according to the procedure of Example 3A. According to the XRD, the resulting article contains CZTS/Se (with 71.5% of sulfur replaced with selenium) and molybdenum.

Example 3I

A CZTS precursor-coated substrate was prepared as described in Example 2I. The coated substrate was placed in a graphite box containing 150 mg of elemental selenium in a small ceramic boat and also 40 mg of Sn, which was divided between 4 small ceramic boats containing 10 mg of Sn each, and heated at 560° C. for 20 min.

Example 3J

A CZTS precursor-coated substrate was prepared as described in Example 2J and annealed according to the procedure of Example 3A with the following changes: Two ceramic boats (0.984"×0.591"×0.197") were located at the two ends of the graphite box, each containing 100 mg of selenium. The tube containing the graphite boxes was heated at 520° C. for 20 min.

Example 4

Examples 4A-4J illustrate the preparation of photovoltaic cells incorporating an absorber layer derived from CZTS precursor inks. Example 4J illustrates the preparation of a photovoltaic cell on a flexible substrate.

Example 4A

A p-type CZTS/Se film was formed on a photovoltaic cell substrate according to the procedure of Example 3A. CdS, i-ZnO, ITO, silver lines, and indium electrodes were then consecutively deposited as described above. According to I-V analysis, the device had an active-area efficiency of 9.88% (Voc=438 mV; Jsc=−33.96 mA/cm$^2$; Fill-factor=66.4%; area=0.326 cm$^2$).

Example 4B

A p-type CZTS/Se film was formed on a photovoltaic cell substrate according to the procedure of Example 3B. CdS (with gold foil in the bath), i-ZnO, ITO, silver lines, and indium electrodes were then consecutively deposited as described above. According to I-V analysis, the device had an efficiency of 0.05% (Voc=32 mV; Jsc=−6.43 mA/cm$^2$; Fill-factor=24.8%; area ~0.35 cm$^2$).

Example 4C

A p-type CZTS/Se film was formed on a photovoltaic cell substrate according to the procedure of Example 3C. CdS (with gold foil in the bath), i-ZnO, ITO, silver lines, and indium electrodes were then consecutively deposited as described above. According to I-V analysis, the device had an active-area efficiency of 5.11% (Voc=385 mV; Jsc=−25.10 mA/cm$^2$; Fill-factor=53.0%; area=0.345 cm$^2$).

Example 4D

A p-type CZTS/Se film was formed on a photovoltaic cell substrate according to the procedure of Example 3D. CdS (with gold foil in the bath), i-ZnO, ITO, silver lines, and indium electrodes were then consecutively deposited as described above. According to I-V analysis, the device had an active-area efficiency of 6.58% (Voc=350 mV; Jsc=−30.10 mA/cm$^2$; Fill-factor=62.4%; area=0.360 cm$^2$).

Example 4E

A p-type CZTS/Se film was formed on a photovoltaic cell substrate according to the procedure of Example 3E. CdS (with gold foil in the bath), i-ZnO, ITO, silver lines, and indium electrodes were then consecutively deposited as described above. According to I-V analysis, the device had an active-area efficiency of 5.53% (Voc=398 mV; Jsc=−26.76 mA/cm$^2$; Fill-factor=52.0%; area=0.326 cm$^2$).

Example 4F

A p-type CZTS/Se film was formed on a photovoltaic cell substrate according to the procedure of Example 3F. CdS (with gold foil in the bath), i-ZnO, ITO, silver lines, and indium electrodes were then consecutively deposited as described above. According to I-V analysis, the device had an active-area efficiency of 6.57% (Voc=400 mV; Jsc=−29.64 mA/cm$^2$; Fill-factor=55.4%; area=0.358 cm$^2$).

Example 4G

A p-type CZTS/Se film was formed on a photovoltaic cell substrate according to the procedure of Example 3G. CdS, i-ZnO, ITO, silver lines, and indium electrodes were then consecutively deposited as described above. According to I-V analysis, the device had an active-area efficiency of 8.51% (Voc=424 mV; Jsc=−32.63 mA/cm$^2$; Fill-factor=61.5%; area=0.333 cm$^2$).

Example 4H

A p-type CZTS/Se film was formed on a photovoltaic cell substrate according to the procedure of Example 3H. The photovoltaic cell was then etched in a 0.5 M KCN solution at 50° C. for 1 min, rinsed with deionized (DI) water; then etched in 0.1M HCl solution at room temperature for 1 min, rinsed with DI water again, and dried with a nitrogen stream. CdS, i-ZnO, ITO, silver lines, and indium electrodes were then consecutively deposited as described above. According to I-V analysis, the device had an active-area efficiency of 8.02% (Voc=393 mV; Jsc=−32.64 mA/cm$^2$; Fill-factor=62.5%; area=0.322 cm$^2$).

Example 4I

A p-type CZTS/Se film was formed on a photovoltaic cell substrate according to the procedure of Example 3I. The photovoltaic cell was then etched in a 0.5 M KCN solution at 50° C. for 1 min and then rinsed with deionized water. CdS, i-ZnO, ITO, silver lines, and indium electrodes were then consecutively deposited as described above. According to I-V analysis, the device had an active-area efficiency of 6.32% (Voc=404 mV; Jsc=−28.97 mA/cm$^2$; Fill-factor=54.0%; area=0.353 cm$^2$).

Example 4J

A p-type CZTS/Se film was formed on a flexible photovoltaic cell substrate according to the procedure of Example 3J. CdS, i-ZnO, ITO, silver lines, and indium electrodes were then consecutively deposited as described above, except that the stirring rate of the CdS bath was 60 rpm. According to I-V analysis, the device had an active-area efficiency of 6% (Voc=375 mV; Jsc=−30.3 mA/cm$^2$; Fill-factor=53.1%; area=0.281 cm$^2$).

Example 5

Exchange of Capping Agents

Examples 5A-5C illustrate the exchange of oleylamine capping agents with butanethiol capping agents on $Cu_2SnS_3$, ZnS, and SnS nanoparticles.

Example 5A $Cu_2SnS_3$ nanoparticles (1 g) were dispersed by bath sonication for 20 min in 10 mL of a mixture of 1-butanethiol and toluene (with a 1-butanethiol:toluene volume ratio of 5:95). Ethanol (20 mL) was added to flocculate the nanoparticles, which were then collected by centrifugation and decanting the supernatant.

Example 5B

ZnS nanoparticles (1 g) were dispersed by bath sonication for 20 min in 10 mL of a 1-butanethiol and toluene mixture (with a 1-butanethiol:toluene volume ratio of 5:95). Ethanol (20 mL) was added to flocculate the nanoparticles, which were then collected by centrifugation and decanting the supernatant.

Example 5C

SnS nanoparticles (1 g) were dispersed by bath sonication for 20 min in 10 mL of a 1-butanethiol and toluene mixture (with a 1-butanethiol:toluene volume ratio of 5:95). Ethanol (20 mL) was added to flocculate the nanoparticles, which were then collected by centrifugation and decanting the supernatant.

Example 6

CuS Nanoparticle Synthesis

Cu(II) acetylacetonate (1.047 g) was dissolved in 80 mL of chloroform. Ammonium sulfide (1.6 mL of a 40-48 wt. % solution in water) was added to 160 mL of water, and the resulting solution was slowly added to the chloroform solution. The two-phase mixture was shaken for 2 min. The aqueous phase, which turned from transparent pale yellow to dark brown after shaking, was separated and mixed with 160 mL of acetonitrile to flocculate the resulting nanoparticles. The nanoparticles were then isolated by centrifuging and discarding the supernatant. According to TEM, the nanoparticles were nanodiscs of about 100 nm diameter and 10 to 20 nm thickness. Zeta-potential of the CuS nanoparticles in water was about −40 mV, which was consistent with negatively charged ions, such as $S^{2-}$ ions, on the nanoparticle surface. Tof-SIMS and ESCA analysis indicated some copper sulfate impurities in this sample. According to FTIR, TEM, and Tof-SIMS analysis, there were only trace organic impurities in this sample.

Example 7

ZnS Nanoparticle Synthesis

The procedure of Example 6 was followed using 1.2 g of zinc acetylacetonate hydrate, 20 mL of chloroform, 4 mL of the ammonium sulfide solution, 50 mL of water, and 50 mL of acetonitrile. The pellet of nanoparticles was further purified by washing with 60 mL of methanol, followed by another wash with 30 mL of methanol. According to TEM, the resulting nanoparticles were close to spherical in shape and 1 to 5 nm in diameter. Zeta-potential of the ZnS nanoparticles in water was about −28 mV, which was consistent with negatively charged ions, such as $S^{2-}$ ions, on the nanoparticle surface. FTIR, TEM, and Tof-SIMS analysis indicated the presence of organic impurities in this sample.

Example 8

SnS Nanoparticle Synthesis

The procedure of Example 6 was followed using 1.62 g of tin(II) ethylhexanoate, 20 mL of chloroform, 4 mL of the ammonium sulfide solution, 50 mL of water, and 50 mL of acetonitrile. The pellet of nanoparticles was further purified by washing with 20 mL of methanol. According to TEM, the resulting nanoparticles were close to spherical in shape and 5 to 10 nm in diameter. Zeta-potential of the SnS nanoparticles in water was about −47 mV, which was consistent with negatively charged ions, such as $S^{2-}$ ions, on the nanoparticle surface. FTIR, TEM, and Tof-SIMS analysis indicated the presence of organic impurities in this sample.

Example 9

Preparation of a CZTS Precursor Ink

The nanoparticles obtained in Examples 6 through 8 were used to formulate inks. Approximately 227 mg of CuS nanoparticles, 198 mg of ZnS nanoparticles, and 215 mg of SnS nanoparticles were each dispersed in 1 mL of deionized water. The three dispersions were sonicated in a bath sonicator for 20 min. Then 846 microliters of the CuS dispersion, 490 microliters of the ZnS dispersion, and 698 microliters of the SnS dispersion were mixed. The resulting CZTS precursor ink was further sonicated for 15 min.

Example 10

Preparation of a Coated Substrate

A portion of the CZTS precursor ink of Example 9 was deposited and spin-coated onto a molybdenum-coated glass substrate with a three-step spinning procedure involving ramp rates of 1000 rpm: (1) spin at 1000 rpm for 15 sec, (2) then spin at 1500 rpm for 20 sec, and (3) finally, spin at 3000 rpm for 5 sec. The deposition and spin coating procedures were repeated 7 times to yield an 8-layer coating. After spin-coating each layer, the sample was soft-baked in the air on a hot plate at 200° C. for 2 min.

Example 11

Formation of a CZTSe Film

A substrate coated with a CZTS precursor layer was prepared as described in Example 10. The coated substrate was placed in a graphite box containing 150 mg of elemental selenium in a small ceramic boat and heated at 560° C. for 20 min. XRD of the article indicated the presence of CZTSe, Mo, and $MoSe_2$. SEM showed that the CZTSe film had grains of ~200 to 300 nm in size.

Example 12

TOPO-Free Synthesis of $Cu_2SnS_3$, ZnS, and SnS Nanoparticles

Synthesis of Coated ZnS Nanoparticles.

A solution of $ZnCl_2$ (5.72 g, 42 mmol) in 150 mL of oleylamine was heated at 170° C. under a nitrogen atmosphere with continuous magnetic stirring for 1 h, followed by the rapid addition of sulfur (1.613 g, 50.4 mmol) dissolved in 30 mL of oleylamine. The reaction mixture was heated and maintained at 320° C. for 75 min and then cooled in the air for 3 min, then in tap water for 1 min, and then in ice-water until it reached thermal equilibrium with the ice-water bath.

Synthesis of Coated SnS Nanoparticles.

A solution of tin chloride (10.42 g, 40 mmol) in 150 mL of oleylamine was heated at 220° C. under a nitrogen atmosphere with continuous magnetic stirring for 45 min, followed by the rapid addition of sulfur (1.536 g, 48 mmol) dissolved in 30 mL of oleylamine. The reaction mixture was maintained at 220° C. for 30 min and then cooled down naturally in air.

Synthesis of Coated $Cu_2SnS_3$ Nanoparticles.

A solution of CuCl (3.96 g, 40 mmol), and $SnCl_4$ (5.21 g, 20 mmol) in 150 mL of oleylamine was heated at 280° C. under a nitrogen atmosphere with continuous mechanical stirring for 30 min, followed by the addition of sulfur (1.92 g, 60 mmol) dissolved in 30 mL of oleylamine. The reaction mixture was stirred at 280° C. for 30 minutes and then cooled down naturally in the air.

Isolation of Coated ZnS SnS and $Cu_2SnS_3$ Nanoparticles.

Following the above syntheses, hexane (180 mL for ZnS/$Cu_2SnS_3$, 20 mL for SnS) was added to disperse the particles. Ethanol (360 mL) was added to flocculate the particles, which were then collected through centrifugation and decanting the supernatant. The synthesized nanoparticles were dried in vacuum overnight.

Purification of Coated ZnS SnS and $Cu_2SnS_3$ Nanoparticles.

Following isolation, further purification of the nanoparticles was carried out as follows: 10 mL of hexane was added to each gram of dried product to disperse the particles. Then 30 mL of ethanol was added to flocculate the particles. The particles were collected through centrifugation and decanting the supernatant. This dispersion-flocculation-collection process was carried out twice for the ZnS nanoparticles and once for the SnS and $Cu_2SnS_3$ nanoparticles.

Example 13

Example 13 presents characterization data on an annealed CZTS/Se film, which supports a microstructure comprising a large-grain CZTS/Se layer and an adjacent fine-grain layer, comprising nanoparticles of CZTS/Se and ZnS/Se embedded in a carbon matrix.

A CZTS precursor ink was prepared as described in Example 1A. A CZTS precursor-coated substrate was prepared as follows. A portion of the CZTS precursor ink was deposited and spin-coated onto a Mo-coated glass substrate with a three-step spinning procedure as follows: (1) ramp to 1000 rpm and spin at 1000 rpm for 10 sec, (2) then spin at 1500 rpm for 15 sec, and (3) finally, spin at 3000 rpm for 5 sec. After spin-coating, the sample was soft-baked in air on a hot plate at 175° C. for 2 min and then at 350° C. for 2 min. The deposition, spin-coating, and soft-baking procedures were repeated 7 additional times to yield an 8-layer coating. A p-type CZTS/Se film was formed by annealing the CZTS precursor-coated substrate for 20 min at 560° C. in the presence of elemental Se as described in Example 3A. CdS, i-ZnO, ITO, Ag lines, and In electrodes were then consecutively deposited as described above. According to I-V analysis, the device had an active-area efficiency of 9.01% (Voc=428 mV; Jsc=−31.76 mA/$cm^2$; Fill-factor=66.3%; area=0.295 $cm^2$). This PV device was subjected to detailed characterization by the techniques described below.

A scanning electron microscopy (SEM) image of a fractured cross-section of the device is shown in FIG. 1. The device exhibited a complex microstructure. Viewing from top-to-bottom, the following layers were visible in the SEM image: (1) ITO transparent conductor, (2) dense large-grain CZTS/Se, (3) fine-grain layer (described in more detail below), (4) $MoSe_2$, (5) Mo, and (6) glass substrate. The CdS emitter layer and ZnO buffer layer were too thin to be visualized in the SEM image.

Figure 2:
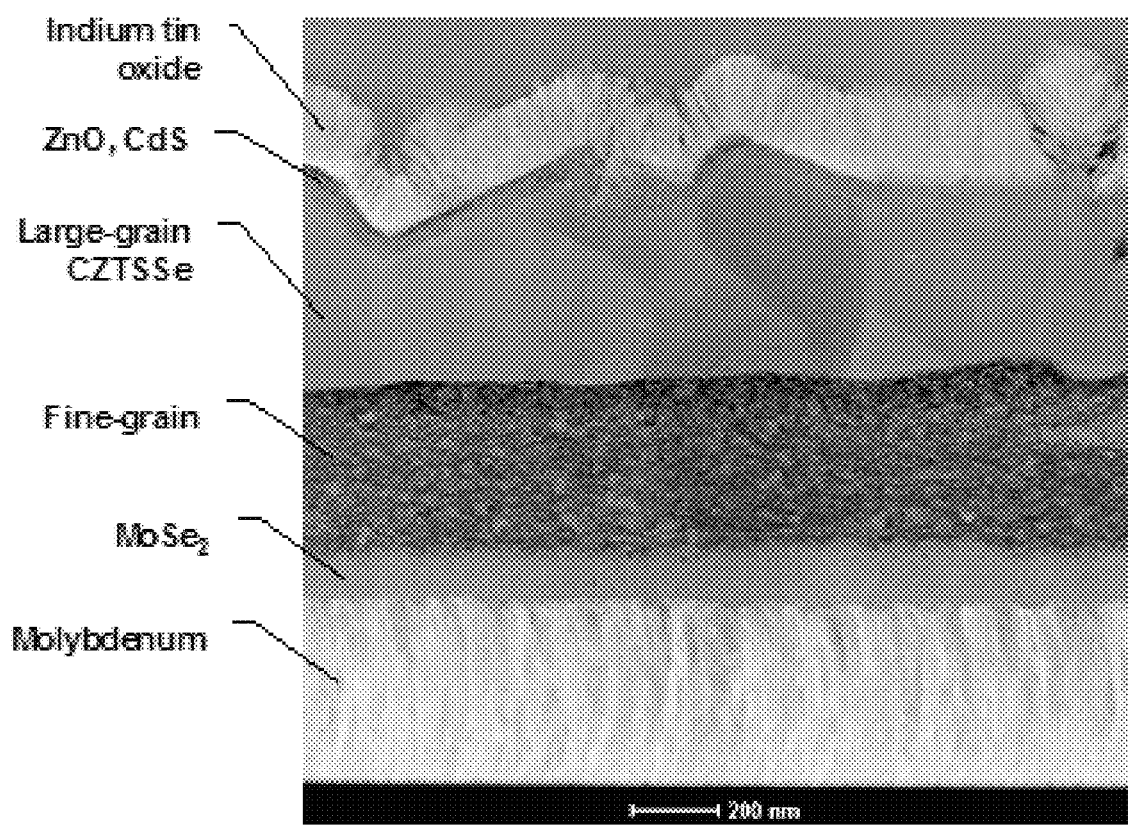
FIG. 2 shows a low-resolution transmission electron microscopy (TEM) image of a section sample of the device of Example 13.

A thin section (~100 nm) of the device was prepared for transmission electron microscopy (TEM) by focused ion beam (FIB) milling. A low-resolution image of the section sample is shown in FIG. 2. Viewing from top-to-bottom, the following layers were visible in the TEM image: (1) ITO transparent conductor, (2) ZnO buffer layer and, CdS emitter, (3) large-grain CZTS/Se with internal grain structure visible, (4) fine-grain layer, (5) MoSe$_2$ and (6) Mo.

Figure 3:
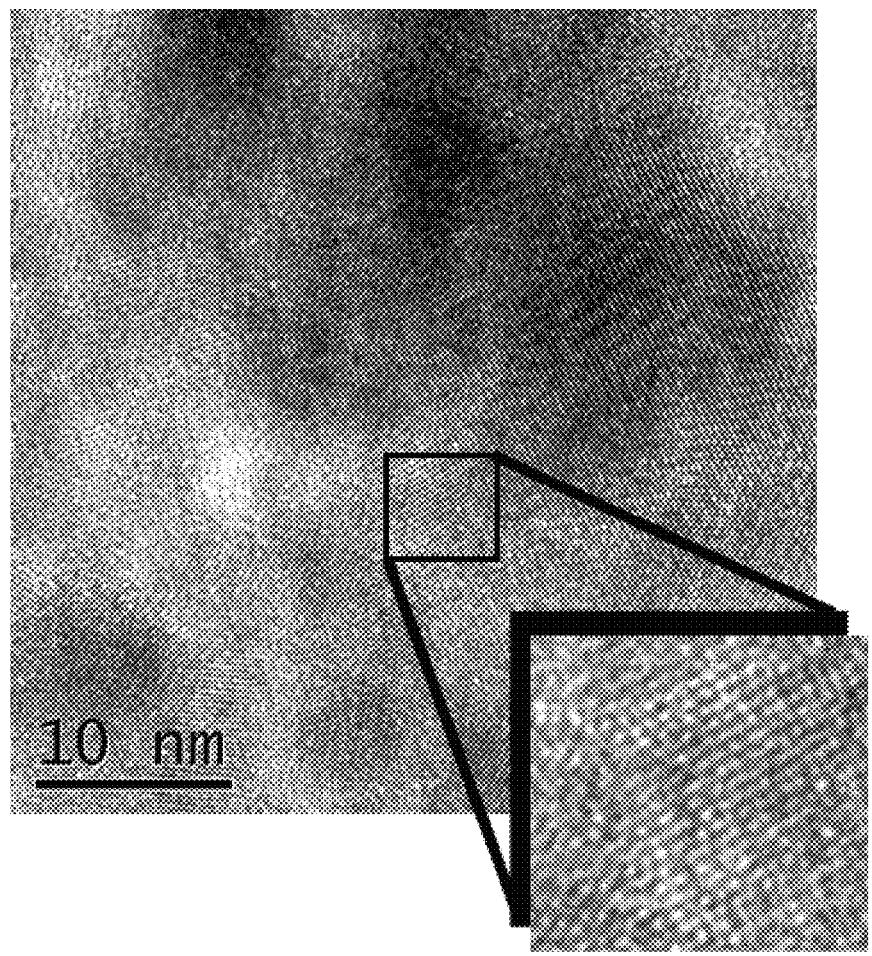
FIG. 3 shows a high-resolution TEM image of the fine-grain layer of the device of Example 13.
Figure 4:
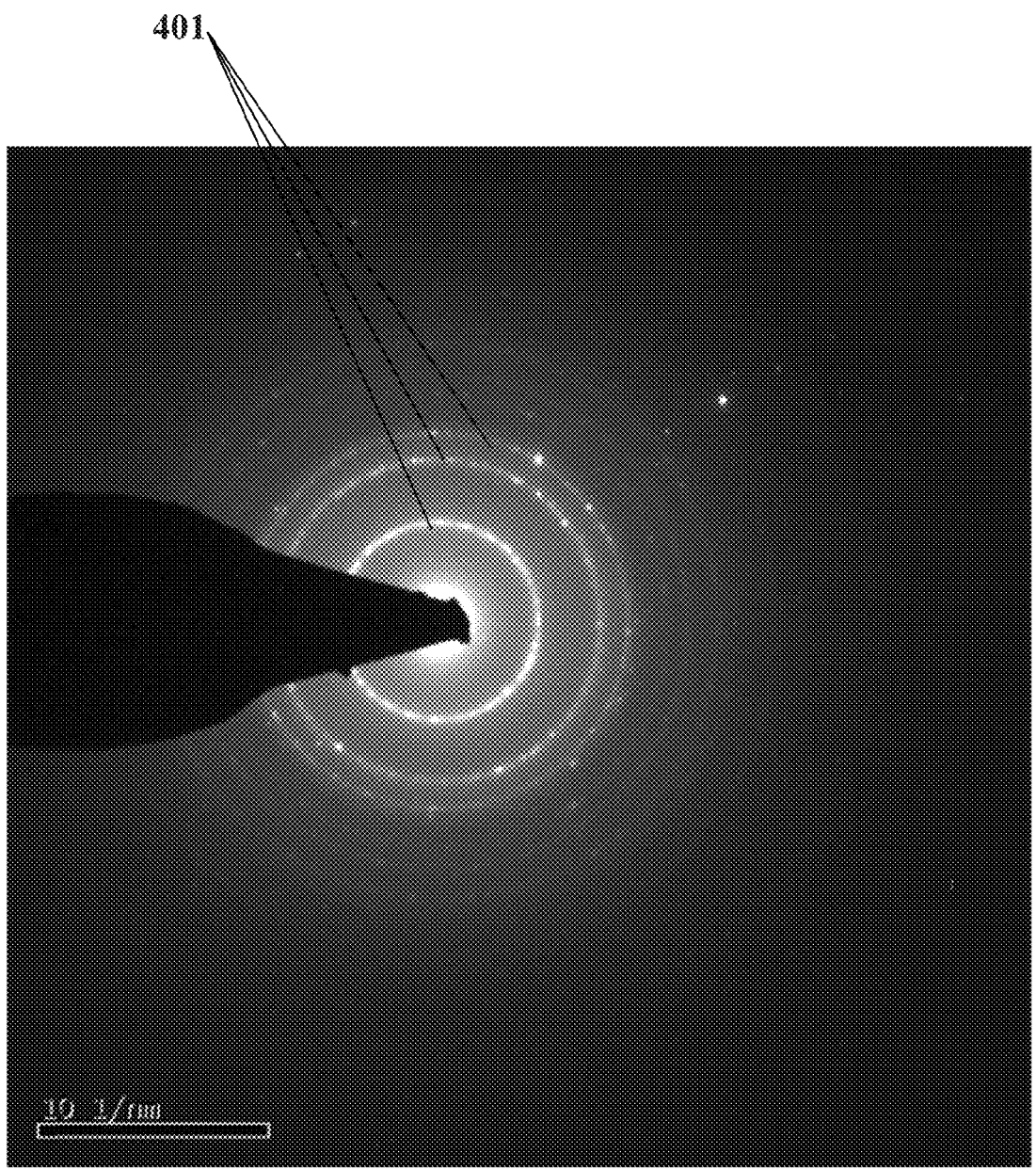
FIG. 4 shows the electron-diffraction pattern obtained from the fine-grain layer of the device of Example 13.

A high-resolution image (FIG. 3) of the fine-grain layer showed the presence of nanocrystalline particles, as demonstrated by the presence of well-resolved regions of lattice spacings (FIG. 3, inset) within an overall amorphous background structure. FIG. 4 shows the electron diffraction pattern obtained from the fine-grain layer. Well-resolved diffraction rings (401) confirmed the presence of crystalline particles, with no evidence of preferred orientation within the amorphous matrix. The observed diffraction pattern is consistent with the presence of nanoparticles of CZTS/Se, ZnS and ZnSe within the fine-grain layer.

Figure 5:
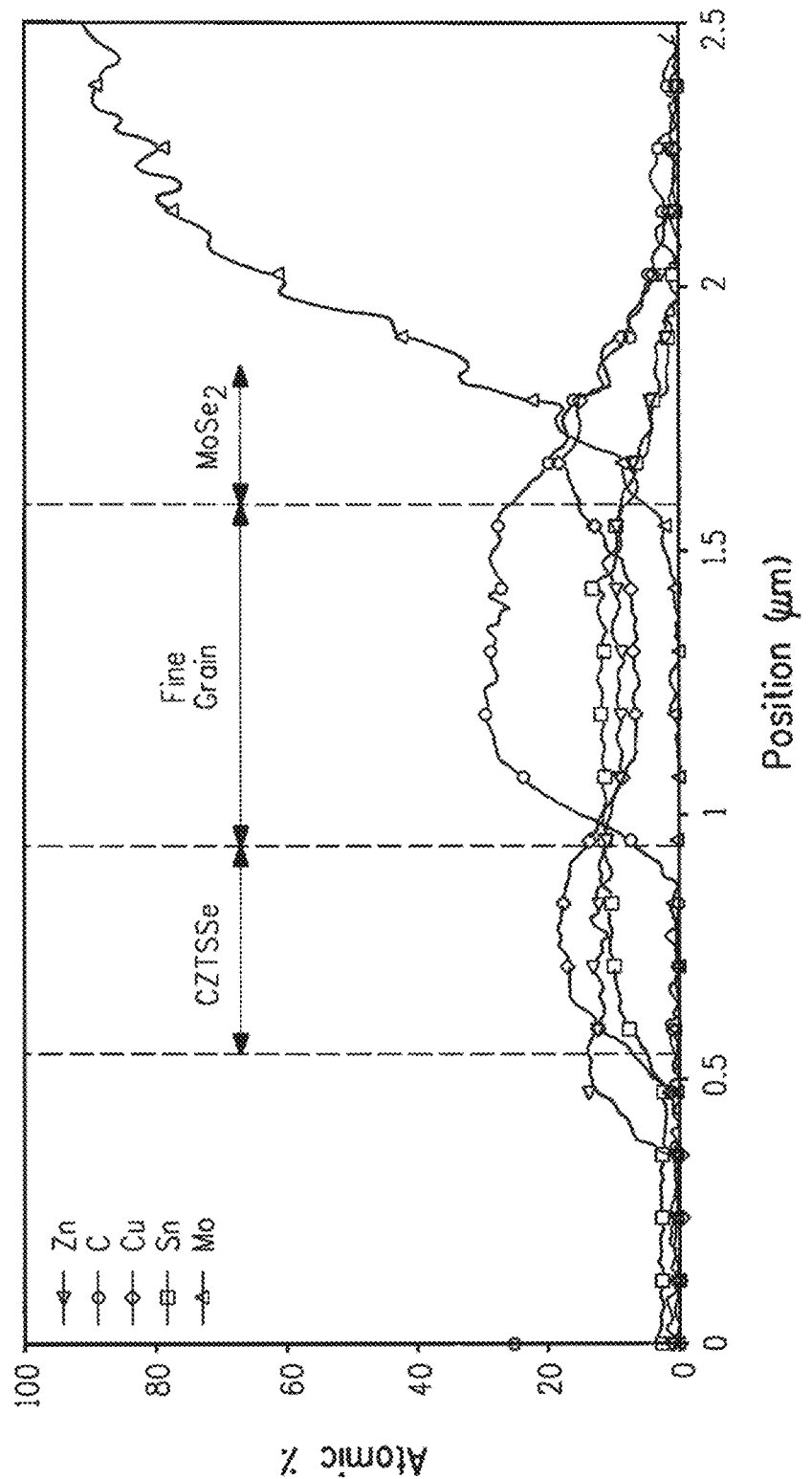
FIG. 5 shows the Auger depth profile for the device of Example 13.

The device was characterized by Auger depth profiling employing a defocused ion beam and Zalar rotation (Evans Analytical Group, East Windsor, N.J.). Results of the Auger depth profiling are shown in FIG. 5. The profile demonstrated that, in contrast to the large-grain CZTS/Se layer, the fine-grain layer contained a significant amount of carbon (~30 atom percent) in addition to the constituent elements of CZTS/Se, consistent with the fine-grain layer being comprised of a mixture of metal chalcogen nanoparticles dispersed within a carbon matrix.

Figure 6:
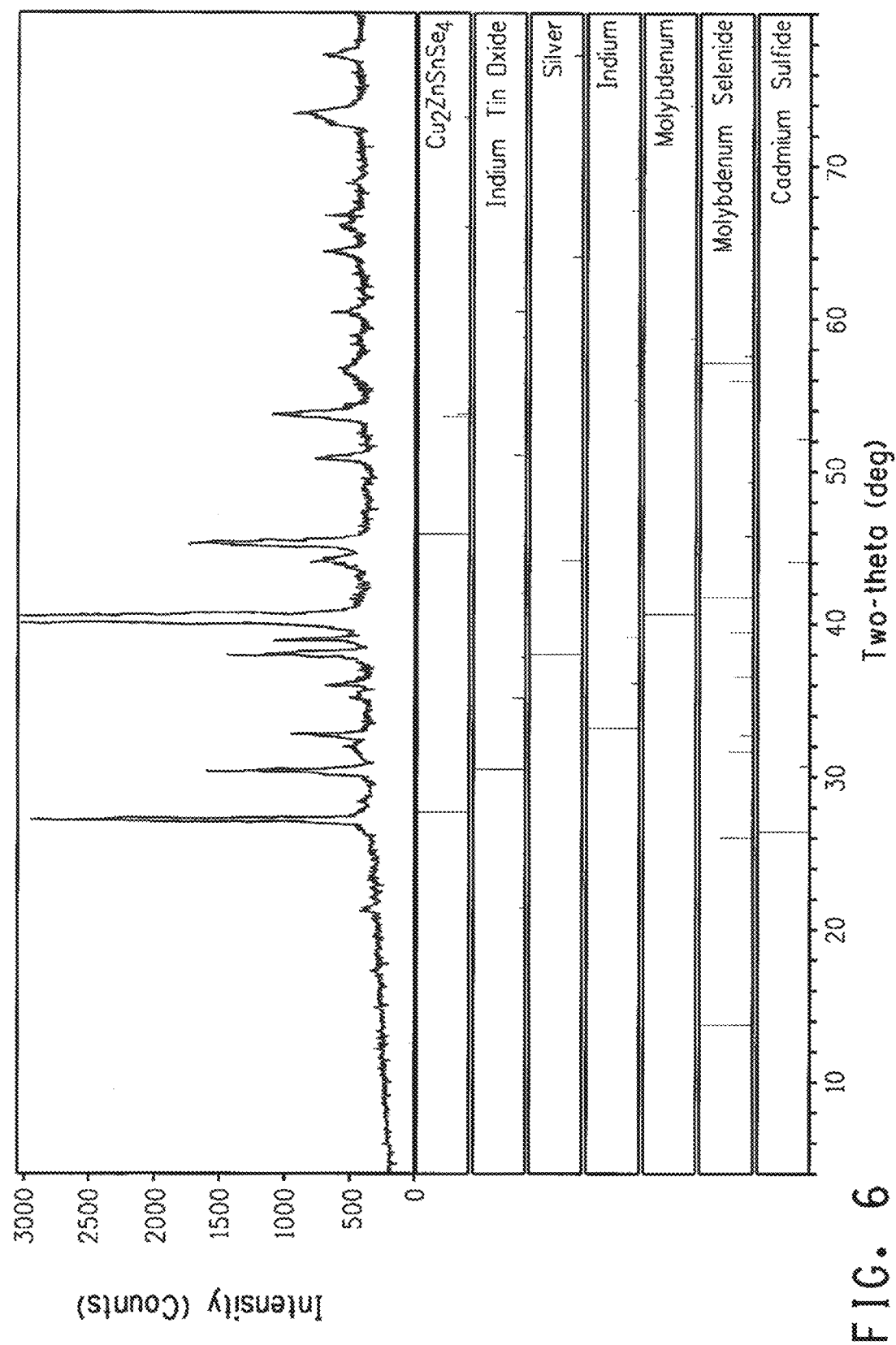
FIG. 6 shows the X-ray diffraction pattern of the device of Example 13.

The X-ray diffraction (XRD) pattern of the finished device is shown in FIG. 6. The diffraction pattern indicated that the finished device contained the following crystalline species at detectable levels: CZTS/Se (82.8% Se, 17.2% S), ITO, Ag (top conductor), In (added during testing as a contacting aid for device electrical testing), Mo, MoSe$_2$ and CdS.

The results of X-ray Absorption Near-Edge Spectroscopy (XANES) analysis of the device are presented in Table 1. The data confirmed the presence of ZnS and ZnSe, as well as the composition of copper in the fine-grain layer as nanocrystalline particles of CZTS/Se or CuS (trace).

TABLE 1

XANES Analysis

| | Atom %, excluding contribution from ZnO buffer layer |
|---|---|
| Substances: Cu | |
| CZTS | 12% |
| CuS | 3% |
| CZTSe | 85% |
| Substances: Zn | |
| CZTS | 5% |
| ZnS | 16% |
| CZTSe | 65% |
| ZnSe | 14% |

Figure 7:
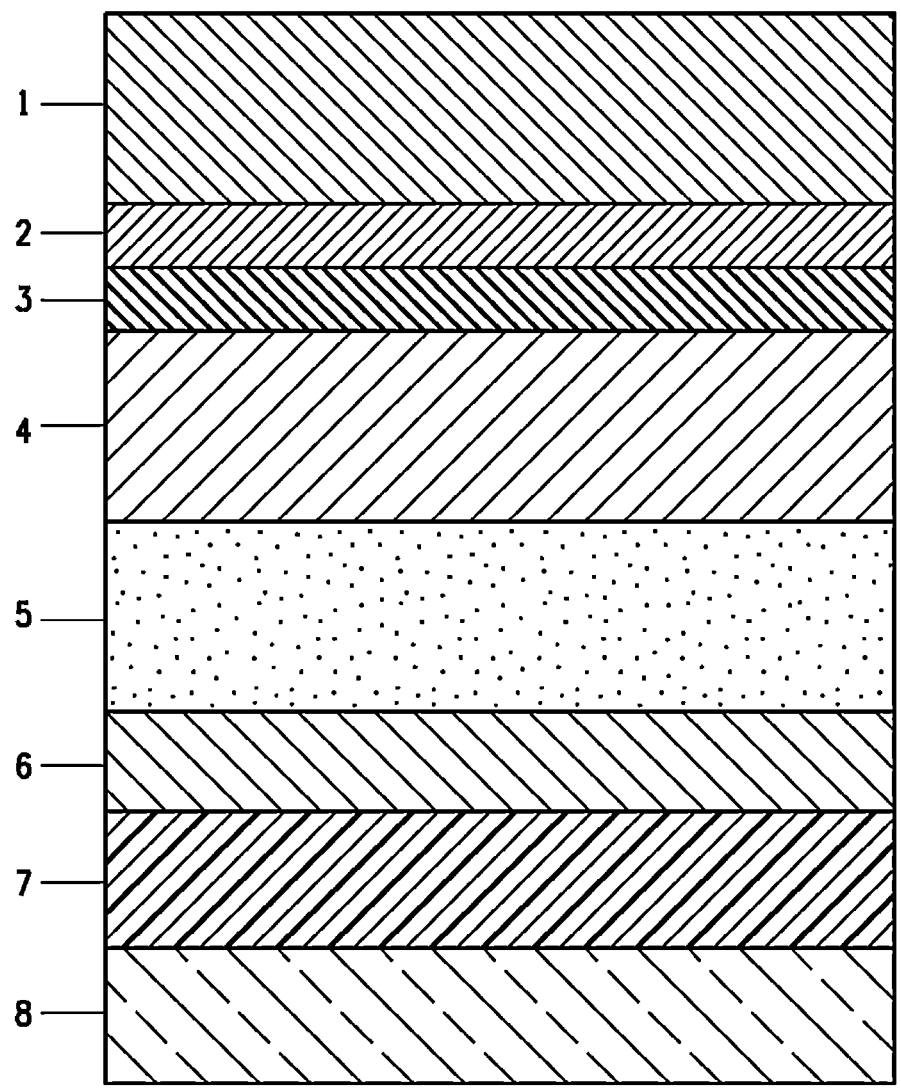
FIG. 7 is a schematic depiction of the device microstructure of Example 13.

A schematic depiction of the device microstructure, as determined by the measurements described above, is shown in FIG. 7. Referring to FIG. 7, a large-grain CZTS/Se layer, 4, a fine-grain layer, 5, and layer comprising MoSe$_2$ crystals, 6, were formed on Mo metal, 7, during thermal processing of the precursor ink. After thermal processing was completed, a CdS emitter layer, 3, a ZnO buffer layer, 2, and an ITO layer, 1, were added. The large-grain CZTS/Se layer, 4, is comprised of a dense mat of micron-scale grains of CZTS/Se and forms the active p-n junction with the CdSe emitter. Adjacent to the large-grain CZTS/Se layer is the small grain layer, 5, which is comprised of a carbon matrix with embedded nanocrystals of CZTS/Se, ZnS and ZnSe.

What we claim is:

1. A CZTS/Se precursor ink comprising:
   a) a fluid medium;
   b) coated binary or ternary copper-containing chalcogenide nanoparticles;
   c) coated binary or ternary tin-containing chalcogenide nanoparticles; and
   d) coated binary zinc-containing chalcogenide nanoparticles,
   wherein the molar ratio of Cu:Zn:Sn of the CZTS/Se precursor ink is about 2:1:1 and the ratio of total chalcogen to (Cu+Zn+Sn) of the CZTS/Se precursor ink is at least 1.

2. The CZTS/Se precursor ink of claim 1, wherein the copper-containing chalcogenide is selected from the group consisting of Cu$_2$S, CuS, Cu$_2$Se, CuSe, Cu$_2$(S,Se), Cu(S,Se), Cu$_2$SnS$_3$, Cu$_4$SnS$_4$, Cu$_2$SnSe$_3$, Cu$_2$Sn(S,Se)$_3$, and mixtures thereof; the tin-containing chalcogenide is selected from the group consisting of SnS$_2$, SnS, SnSe$_2$, SnSe, Sn(S,Se)$_2$, Sn(S,Se), Cu$_2$SnS$_3$, Cu$_4$SnS$_4$, Cu$_2$SnSe$_3$, Cu$_2$Sn(S,Se)$_3$, and mixtures thereof; and the zinc-containing chalcogenide is selected from the group consisting of ZnS, ZnSe, Zn(S,Se), and mixtures thereof.

3. The CZTS/Se precursor ink of claim 2, wherein the copper-containing chalcogenide comprises Cu$_2$SnS$_3$, the tin-containing chalcogenide comprises Cu$_2$SnS$_3$ and SnS, and the zinc-containing chalcogenide comprises ZnS.

4. The CZTS/Se precursor ink of claim 1, wherein the coated copper-, tin-, and zinc-containing chalcogenide nanoparticles are coated with organic molecules comprising N-, O-, S-, Se- or P-based donor atoms.

5. The CZTS/Se precursor ink of claim 4, wherein the organic molecules comprise oleylamine.

6. The CZTS/Se precursor ink of claim 4, wherein the organic molecules comprise an alkyl thiol.

7. The CZTS/Se precursor ink of claim 1, wherein the fluid medium is selected from the group consisting of aromatics, heteroaromatics, alkanes, organic halides, ketones, esters, nitriles, amides, amines, thiols, thioethers, pyrrolidinones, ethers, alcohols, carbonates, water, and mixtures thereof.

8. The CZTS/Se precursor ink of claim 7, wherein the fluid medium comprises an alkyl thiol.

9. A coated substrate comprising:
   a) a substrate; and
   b) at least one layer of a CZTS/Se precursor ink disposed on the substrate, wherein the CZTS/Se precursor ink comprises:
      i) coated binary or ternary copper-containing chalcogenide nanoparticles;
      ii) coated binary or ternary tin-containing chalcogenide nanoparticles; and
      iii) coated binary zinc-containing chalcogenide nanoparticles,
      wherein the molar ratio of Cu:Zn:Sn of the CZTS/Se precursor ink is about 2:1:1 and the ratio of total chalcogen to (Cu+Zn+Sn) of the CZTS/Se precursor ink is at least 1.

10. The coated substrate of claim 9, wherein the coated copper-containing chalcogenide is selected from the group consisting of Cu$_2$S, CuS, Cu$_2$Se, CuSe, Cu$_2$(S,Se), Cu(S,Se), Cu$_2$SnS$_3$, Cu$_4$SnS$_4$, Cu$_2$SnSe$_3$, Cu$_2$Sn(S,Se)$_3$, and mixtures thereof; the tin-containing chalcogenide is selected from the group consisting of SnS$_2$, SnS, SnSe$_2$, SnSe, Sn(S,Se)$_2$, Sn(S, Se), Cu$_2$SnS$_3$, Cu$_4$SnS$_4$, Cu$_2$SnSe$_3$, Cu$_2$Sn(S,Se)$_3$, and mixtures thereof; and the zinc-containing chalcogenide is selected from the group consisting of ZnS, ZnSe, Zn(S,Se), and mixtures thereof.

11. A process comprising disposing a CZTS/Se precursor ink onto a substrate to form a coated substrate, wherein the CZTS/Se precursor ink comprises:
   a) a fluid medium;
   b) coated binary or ternary copper-containing chalcogenide nanoparticles;
   c) coated binary or ternary tin-containing chalcogenide nanoparticles; and
   d) coated binary zinc-containing chalcogenide nanoparticles, wherein the molar ratio of Cu:Zn:Sn of the CZTS/Se precursor ink is about 2:1:1 and the ratio of total chalcogen to (Cu+Zn+Sn) of the CZTS/Se precursor ink is at least 1.

12. The process of claim 11, further comprising drying the coated substrate at about 80° C. to about 400° C.

13. The process of claim 12, wherein the drying is carried out under an atmosphere comprising oxygen.

14. The process of claim 11 or claim 12, further comprising annealing the coated substrate at about 400° C. to about 800° C., and wherein the annealing comprises thermal processing, rapid thermal processing, rapid thermal annealing, pulsed thermal processing, laser beam exposure, heating via IR lamps, electron beam exposure, pulsed electron beam processing, heating via microwave irradiation, or combinations thereof.

15. The process of claim 14, wherein the annealing is carried out under an atmosphere comprising an inert gas and a chalcogen or tin source.

16. A CZTS/Se film comprising adjacent first and second layers, wherein:
   a) the first layer comprises CZTS/Se grains characterized by an average diameter of at least 0.3 microns; and
   b) the second layer comprises CZTS/Se and ZnS/Se nanoparticles embedded in a carbon matrix.

17. A photovoltaic cell comprising the film of claim 16.

18. The CZTS/Se precursor ink of claim 1 consisting essentially of components a)-d).

19. The CZTS/Se precursor ink of claim 18 wherein the fluid medium comprises 80-98 wt % of the total weight of the ink.

* * * * *